US007074545B2

(12) United States Patent
Mori

(10) Patent No.: US 7,074,545 B2
(45) Date of Patent: Jul. 11, 2006

(54) PRINTING PLATE MATERIAL

(75) Inventor: Takahiro Mori, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 140 days.

(21) Appl. No.: 10/727,903

(22) Filed: Dec. 4, 2003

(65) Prior Publication Data

US 2004/0134365 A1 Jul. 15, 2004

(30) Foreign Application Priority Data

Dec. 12, 2002 (JP) ............................ 2002-360634

(51) Int. Cl.
*G03F 7/004* (2006.01)

(52) U.S. Cl. .................. 430/278.1; 430/302; 101/456; 101/465; 101/466; 101/467; 503/227

(58) Field of Classification Search ............ 430/278.1, 430/302, 271.1, 275.1; 101/271.1, 275.1, 101/456, 457, 458, 465, 466, 467; 503/227
See application file for complete search history.

(56) References Cited

U.S. PATENT DOCUMENTS 6,103,087 A 8/2000 Mori
6,868,787 B1 * 3/2005 Mori .......................... 101/453
2003/0031860 A1 * 2/2003 Hotta et al. ................. 428/336
2003/0148207 A1 * 8/2003 Maemoto et al. ........... 430/138
2003/0188653 A1 * 10/2003 Yanaka ....................... 101/453
2004/0055490 A1 * 3/2004 Sampei ........................ 101/458
2004/0103805 A1 * 6/2004 Mori .......................... 101/459

FOREIGN PATENT DOCUMENTS

| | | |
|---|---|---|
| EP | 0 292 801 A2 | 11/1988 |
| EP | 0 925 916 A1 | 6/1999 |
| EP | 1 108 533 A1 | 6/2001 |
| EP | 1 132 200 A2 | 9/2001 |
| EP | 1 188 580 A2 | 3/2002 |

* cited by examiner

*Primary Examiner*—John S. Chu
(74) *Attorney, Agent, or Firm*—Lucas & Mercanti, LLP

(57) ABSTRACT

Disclosed are a printing plate material capable of being developed on a printing press and its manufacturing method which comprises the steps of subjecting an aluminum plate to electrolytic surface roughening treatment, subjecting the electrolytic surface roughened aluminum plate to etching treatment in an aqueous alkali solution, subjecting the resulting aluminum plate to anodization treatment, whereby an aluminum support is obtained, and providing on the aluminum support an image formation layer which contains thermoplastic particles and a light-to-heat conversion dye and changes in color due to infrared laser exposure.

20 Claims, No Drawings

PRINTING PLATE MATERIAL

FIELD OF THE INVENTION

The present invention relates to a printing plate material, and particularly to a printing plate material capable of forming an image by a computer to plate (CTP) system.

BACKGROUND OF THE INVENTION

The printing plate material for CTP, which is inexpensive, can be easily handled, and has a printing ability comparable with that of a PS plate, is required accompanied with the digitization of printing data.

Recently, a thermal processless printing plate material which can be applied to a printing press employing a direct imaging (DI) process without development by a special developing agent or a versatile thermal processless printing plate material which can be treated in the same manner as in PS plates has been required.

As the thermal processless printing plate material for DI, there is a Thermo Lite produced by Agfa Co., Ltd. However, this plate material requires development on press, and when the plate is mounted on a printing press, and printing is carried out in the same printing sequence as in a conventional PS plate, good initial printability cannot be obtained. Further, this plate has problem in that stain occurs during printing due to some combination of dampening water and printing ink, and is not so high in versatility. Furthermore, this plate does not have an exposure visualization property, since plate inspection after thermal laser exposure is not considered.

Properties required for a versatile processless printing plate are good initial printability, in which printing can start under the same printing conditions as a conventional PS plate (without any special development on a printing press); broad versatility, in which a conventional dampening water or printing ink used in the PS plate can be also used; and an image visualization property after imagewise exposure.

It is expected in the CTP system that procedure of plate inspection will be not carried out in future. However, the plate inspection is still necessary in the present processing procedures. Therefore, in the thermal processless printing plate material, image visualization after image recording is one of the important performances.

The thermal processless type printing plate material is divided into an ablation type printing plate material, and a development-on-press type heat fusible image formation printing plate material from the viewpoint of the image formation mechanism. The ablation type printing plate material has problems that it is low in sensitivity due to its image recording mechanism, and it is necessary to provide, in an exposure device, a sucking device for preventing a part of the image formation layer from scattering during laser exposure of the printing plate material.

The development-on-press type heat fusible image formation printing plate material is more advantageous than the ablation type printing plate material, in that it is high in sensitivity, and it does not scatter a part of the image formation layer during laser exposure of the printing plate material.

As the development-on-press type heat fusible image formation printing plate material, a printing plate material disclosed in JP-2938397 is cited which comprises a hydrophilic layer or a grained aluminum plate and provided thereon, an image formation layer containing thermoplastic particles and a water soluble binder. The Thermo Lite described above produced by Agfa Co., Ltd. is this type of a processless printing plate material.

In the development-on-press type heat fusible image formation printing plate material, developability on press or printing performance such as initial printability or anti-stain property is greatly influenced by kinds of materials contained in the image formation layer. A dye used as a light-to-heat conversion material or a dye precursor or discoloring agent for providing exposure visualization has a great influence on the printing performance. This is probably because the dye, or the dye precursor or discoloring agent is strongly adsorbed on the grained surface of the aluminum plate, and is difficult to remove with a dampening water and/or printing ink.

A planographic printing plate material is proposed which employs a light-to-heat conversion material and improves initial printability and anti-stain property. For example, a planographic printing plate material is proposed which comprises a substrate and provided thereon, an image formation layer containing an infrared absorbing dye, and an outermost layer in that order, wherein on imagewise exposure, the outermost layer forms hydrophilic portions and a hydrophobic portions resulting in image formation, and the optical density of the image formation layer varies (see, for example, Japanese Patent O.P.I. Publication No. 11-240270). Further, a planographic printing plate material is proposed which comprises a hydrophilic substrate and provided thereon, an image formation layer containing thermoplastic particles comprised of a homopolymer or copolymer of styrene and a hydrophilic binder having a carboxyl group, wherein the image formation layer or its adjacent layer comprised of a heat sensitive image formation composition containing an anionic infrared cyanine dye (see, for example, Japanese Patent O.P.I. Publication No. 11-265062).

However, they neither improve initial printability nor an anti-stain property. Further, neither of the references refers to conception that improves initial printability and an anti-stain property by optimizing the surface configuration of an aluminum support as a support of a printing plate material.

As is described above, the conventional processless printing plate materials do not have good initial printability, good anti-stain property, and exposure visualization.

SUMMARY OF THE INVENTION

The present invention has been made in view of the above. An object of the invention is to provide a printing plate material, which is capable of recording an image employing infrared laser, providing improved developability on press, improved anti-stain property and improved exposure visualization.

DETAILED DESCRIPTION OF THE INVENTION

The above object has been attained by one of the following constitutions:

1. A printing plate material comprising an aluminum support, and provided thereon, an image formation layer containing thermoplastic particles and a light-to-heat conversion dye, the printing plate material being capable of being developed on a printing press, wherein the image formation layer changes in color due to infrared laser exposure, and the aluminum support is manufactured by a method comprising the steps of subjecting an aluminum plate to electrolytic surface roughening treatment, subjecting the electrolytic surface roughened aluminum plate to etching treatment in an aqueous alkali solution, and subjecting the resulting aluminum plate to anodization treatment.

2. The printing plate material of item 1 above, wherein an etching amount of the electrolytic surface roughened aluminum plate etched by the etching treatment is 0.05 to 2.0 $\mu m^2$.

3. The printing plate material of item 1 above, wherein mechanical surface roughening treatment is carried out prior to the electrolytic surface roughening treatment.

4. The printing plate material of item 1 above, wherein mechanical surface roughened treatment is carried out prior to the electrolytic surface roughening treatment.

5. The printing plate material of item 1 above, wherein the light-to-heat conversion dye is a cyanine dye having an absorption maximum of from 700 to 12,000 nm.

6. The printing plate material of item 1 above, wherein the light-to-heat conversion dye content of the image formation layer is from 0.01 to 10% by weight and the thermoplastic particle content of the image formation layer is from 1 to 90% by weight.

7. The printing plate material of item 1 above, wherein the light-to-heat conversion dye in the image formation layer changes in color due to infrared laser exposure.

8. The printing plate material of item 1 above, wherein the image formation layer further contains a water soluble resin.

9. The printing plate material of item 8 above, wherein the water soluble resin is oligosaccharide, polysaccharide or polyacrylic acid.

10. The printing plate material of item 9 above, wherein the oligosaccharide is trehalose.

11. A method of manufacturing a printing plate material comprising an aluminum support, and provided thereon, an image formation layer, the printing plate material being capable of being developed on a printing press, the method comprising the steps of subjecting an aluminum plate to electrolytic surface roughening treatment, subjecting the electrolytic surface roughened aluminum plate to etching treatment in an aqueous alkali solution to give an etching amount of the electrolytic surface roughened aluminum plate of 0.05 to 2.0 $g/m^2$, subjecting the resulting aluminum plate to anodization treatment, whereby an aluminum support is obtained, and providing on the aluminum support an image formation layer which contains thermoplastic particles and a light-to-heat conversion dye and changes in color due to infrared laser exposure.

12. The method of item 11 above, wherein mechanical surface roughening treatment is carried out prior to the electrolytic surface roughening treatment.

13. The method of item 11 above, wherein the light-to-heat conversion dye is a cyanine dye having an absorption maximum of from 700 to 12,000 nm.

14. The method of item 11 above, wherein the light-to-heat conversion dye content of the image formation layer is from 0.01 to 10% by weight and the thermoplastic particle content of the image formation layer is from 1 to 90% by weight.

15. The method of item 11 above, wherein the light-to-heat conversion dye in the image formation layer changes in color due to infrared laser exposure.

16. The method of item 11 above, wherein the image formation layer further contains a water soluble resin.

17. The method of item 16 above, wherein the water soluble resin is oligosaccharide, polysaccharide or polyacrylic acid.

18. The method of item 17 above, wherein the oligosaccharide is trehalose.

1-1. A printing plate material capable of being developed on a printing press comprising an aluminum support, and provided thereon, an image formation layer containing thermoplastic particles and a light-to-heat conversion dye wherein color of the image formation layer varies due to infrared laser exposure, and the aluminum support is an aluminum plate subjected to electrolytic surface roughening treatment, followed by etching treatment in an aqueous alkali solution, and subjected to anodization treatment.

1-2. The printing plate material of item 1-1 above, wherein an etching amount of the electrolytic surface roughened aluminum plate etched by the etching treatment is 0.05 to 2.0 $g/m^2$.

1-3. The printing plate material of item 1-1 or 1-2 above, wherein the aluminum support is an aluminum plate which, prior to the electrolytic surface roughening treatment, has been subjected to mechanical surface roughening treatment.

1-4. The printing plate material of any one of items 1-1 through 1-3 above, wherein the color variation of the image formation layer due to infrared laser exposure results from color change of the light-to-heat conversion dye contained in the image formation layer.

The printing plate material of the invention comprises an aluminum support and provided thereon, an image formation layer capable of being developed on a printing press containing thermoplastic particles and a light-to-heat conversion dye wherein color of the image formation layer varies due to infrared laser exposure, and the aluminum support is an aluminum plate subjected to electrolytic surface roughening treatment, and then to anodization treatment, followed by etching treatment in an aqueous alkali solution.

The aluminum support in the invention of the printing plate material of the invention will be explained below.

An aluminum plate used in the aluminum support of the printing plate material of the invention is an aluminum plate or an aluminum alloy plate. As the aluminum alloy, there can be used various ones including an alloy of aluminum and a metal such as silicon, copper, manganese, magnesium, chromium, zinc, lead, bismuth, nickel, titanium, sodium or iron.

It is preferable that the aluminum plate is subjected to degreasing treatment for removing rolling oil prior to the electrolytic surface roughening. The degreasing treatments include degreasing treatment employing solvents such as trichlene and thinner, and an emulsion degreasing treatment employing an emulsion such as kerosene or triethanol. It is also possible to use an aqueous alkali solution such as an aqueous solution of sodium hydroxide, potassium hydroxide, sodium carbonate, or sodium phosphate for the degreasing treatment. When such an aqueous alkali solution is used for the degreasing treatment, it is possible to remove soils and an oxidized film which can not be removed by the above-mentioned degreasing treatment alone. When the aqueous alkali solution is used for the degreasing treatment, the resulting plate is preferably subjected to neutralization treatment in an aqueous solution of an acid such as phosphoric acid, nitric acid, sulfuric acid, chromic acid, or in an aqueous solution of a mixture thereof. The electrolytic surface roughening after the neutralization is carried out preferably in the same acid solution as in the neutralization treatment.

The electrolytic surface roughening treatment of the aluminum plate is carried out according to a known method, but prior to that, chemical surface roughening treatment and/or mechanical surface roughening treatment may be carried out. The mechanical surface roughening treatment is preferably carried out.

The chemical surface roughening treatment is carried out employing an aqueous alkali solution such as an aqueous solution of sodium hydroxide, potassium hydroxide, sodium carbonate, or sodium phosphate in the same manner as in degreasing treatment above. After that, the resulting plate is preferably subjected to neutralization treatment in an aqueous solution of an acid such as phosphoric acid, nitric acid, sulfuric acid, chromic acid, or in an aqueous solution of a mixture thereof. The electrolytic surface roughening after the neutralization is carried out preferably in the same acid solution as in the neutralization treatment.

Though there is no restriction for the mechanical surface roughening method, a brushing roughening method and a honing roughening method are preferable.

The brushing roughening method is carried out by rubbing the surface of the plate with a cylindrical brush with a brush hair with a diameter of 0.2 to 1 mm, while supplying slurry, in which an abrasive is dispersed in water, to the surface of the plate. The honing roughening method is carried out by ejecting obliquely slurry, in which an abrasive is dispersed in water, with pressure applied from nozzles to the surface of the plate.

Examples of the abrasive include those generally used as abrasives such as volcanic ashes, alumina, or silicon carbide. The particle size of the abrasive is #200 to #3000, preferably #400 to #2000, and more preferably #600 to #1000.

After the plate has been roughened mechanically, it is preferably dipped in an acid or an aqueous alkali solution in order to remove abrasives and aluminum dust, etc. which have been embedded in the surface of the substrate or to control the shape of pits formed on the plate surface, whereby the surface is etched. Examples of the acid include sulfuric acid, persulfuric acid, hydrofluoric acid, phosphoric acid, nitric acid and hydrochloric acid, and examples of the alkali include sodium hydroxide and potassium hydroxide.

In the invention, the aluminum plate was mechanically surface roughened with an abrasive with a particle size of not less than #400, followed by etching treatment employing an aqueous alkali solution, whereby a complex surface structure formed due to the mechanical surface roughening treatment can be changed to a surface having a smooth convexoconcave structure. The resulting aluminum plate has a waviness of a relatively long wavelength of several microns to scores microns. The resulting aluminum plate further being subjected to electrolytic surface roughening treatment described later, an aluminum substrate is obtained which provides a good printing performance and good printing durability. Further, the aluminum plate can reduce a quantity of electricity during the electrolytic surface roughening treatment, contributing to cost reduction. The resulting plate after dipped in the aqueous alkali solution is preferably subjected to neutralization treatment in an aqueous solution of an acid such as phosphoric acid, nitric acid, sulfuric acid, chromic acid, or in an aqueous solution of a mixture thereof.

The electrolytic surface roughening treatment in the invention is carried out in an acidic electrolytic solution employing an alternating current. As the acidic electrolytic solution, an acidic electrolytic solution used in a conventional electrolytic surface roughening treatment can be used, but a hydrochloric acid or nitric acid electrolytic solution is preferably used. In the invention, a hydrochloric acid electrolytic solution is especially preferably used.

As a current waveform used in the electrolytic surface roughening treatment, various waveforms such as a rectangular wave, trapezoidal wave, sawtooth wave or sine wave can be used, but sine wave is preferably used. Separated electrolytic surface roughening treatments disclosed in Japanese Patent O.P.I. Publication Nos. 10-869 are also preferably used.

In the electrolytic surface roughening treatment carried out using an electrolytic solution of nitric acid, voltage applied is preferably from 1 to 50 V, and more preferably from 5 to 30 V. The current density (in terms of peak value) used is preferably from 10 to 200 A/dm$^2$, and more preferably from 20 to 150 A/dm$^2$. The total quantity of electricity is preferably 100 to 2000 C/dm$^2$, more preferably 200 to 1500 C/dm$^2$, and most preferably 200 to 1000 C/dm$^2$. Temperature during the electrolytic surface roughening treatment is preferably from 10 to 50° C., and more preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

In the electrolytic surface roughening treatment carried out using an electrolytic solution of hydrochloric acid, voltage applied is preferably from 1 to 50 V, and more preferably from 5 to 30 V. The current density (in terms of peak value) used is preferably from 10 to 200 A/dm$^2$, and more preferably from 20 to 150 A/dm$^2$. The total quantity of electricity is preferably 100 to 2000 C/dm$^2$, and more preferably 200 to 1000 C/dm$^2$. Temperature during the electrolytic surface roughening treatment is preferably from 10 to 50° C., and more preferably from 15 to 45° C. The hydrochloric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

In the invention, the electrolytically surface roughened plate is dipped in an aqueous alkali solution and subjected to etching treatment in order to control the shape of pits formed on the plate surface, whereby the surface is etched. Examples of the alkali solution include a solution of sodium hydroxide or potassium hydroxide.

The etching treatment in the aqueous alkali solution greatly improves initial printability and anti-staining property.

It is well known that the electrolytically surface roughened plate is dipped and subjected to etching treatment in an aqueous acidic solution containing an acid such as sulfuric acid, persulfuric acid, hydrofluoric acid, phosphoric acid, nitric acid or hydrochloric acid. However, the etching treatment employing the aqueous acidic solution is not preferred, since it tends to lower initial printability and to produce staining during printing.

A clear mechanism in that the etching treatment in an aqueous alkali solution provides good results is not apparent. The convexoconcave structure is formed during the electrolytic surface roughening treatment, but when the structure is etched in the aqueous alkali solution or in the aqueous acidic solution, the structure etched in the aqueous alkali solution is different from that etched in the aqueous acidic solution. It is considered that the etching treatment in an aqueous alkali solution, even when the etching amount is slight, smoothens the convexoconcave structure of the aluminum plate surface, and makes it easy to remove, on development on press, a component, which is likely to cause staining, in an image formation layer, particularly a light-to-heat conversion dye or a material providing exposure visualization function as described later.

In the invention, the electrolytically surface roughened plate is dipped in the aqueous alkali solution and subjected to the etching treatment to dissolve the surface of the aluminum plate, and the dissolution amount (hereinafter referred to as etching amount) of aluminum is preferably from 0.05 to 2.0 $g/m^2$. The etching amount of from 0.05 to 2.0 $g/m^2$ smoothens the shape of pits formed during the electrolytic surface roughening treatment, contributing to improvement of printing durability. The etching amount herein referred to is a weight difference ($g/m^2$) between an aluminum plate before the etching treatment and that after the etching treatment.

The resulting plate after dipped in the aqueous alkali solution in the above is preferably subjected to neutralization treatment in an aqueous solution of an acid such as phosphoric acid, nitric acid, sulfuric acid, chromic acid, or in an aqueous solution of a mixture thereof. The anodization treatment after the neutralization treatment is carried out preferably in the same acid solution as in the neutralization treatment.

After the aluminum plate has been subjected to each of the surface treatments described above, it is subjected to anodization treatment.

There is no restriction in particular for the method of anodization treatment used in the invention, and known methods can be used. The anodization treatment forms an anodization film on the surface of the aluminum plate.

For the anodization treatment in the invention there is preferably used a method of carrying out electrolysis by applying a current density of from 1 to 10 $A/dm^2$ to an aqueous solution containing sulfuric acid and/or phosphoric acid in a concentration of from 10 to 50%, as an electrolytic solution. However, it is also possible to use a method of carrying out electrolysis by applying a high current density to sulfuric acid as described in U.S. Pat. No. 1,412,768, or a method of carrying out electrolysis in phosphoric acid as described in U.S. Pat. No. 3,511,661.

The aluminum plate, which has been subjected to anodization treatment, is optionally subjected to sealing treatment. For the sealing treatment, it is possible to use known sealing treatment carried out using hot water, boiling water, steam, an aqueous dichromate solution, a nitrite solution and an ammonium acetate solution.

The aluminum plate subjected to anodization treatment may be subjected to surface treatment other than the sealing treatment. Examples of the surface treatment include known treatments, which are carried out employing silicate, phosphate, various organic acids, or PVPA. Further, the aluminum plate subjected to anodization treatment may be subjected to surface treatment disclosed in Japanese Patent O.P.I. Publication No. 8-314157 in which the aluminum plate is treated in an aqueous bicarbonate solution or the aluminum plate is treated in an aqueous bicarbonate solution, followed by treatment in an organic acid solution such as an aqueous citric acid solution.

The printing plate material of the present invention comprises the image formation layer containing thermoplastic particles, and a light-to-heat conversion material. The printing plate material of the present invention is capable of being developed on a printing press, and the image formation layer changes in color upon irradiation of infrared laser. Herein, "The printing plate material of the present invention is capable of being developed on a printing press" is that the printing plate material is capable of being developed with dampening water and/or printing ink provided in a printing press, on which the printing plate material is mounted, without employing any other specific developer.

The image formation layer used in the printing plate material of the present invention will be explained below.

The thermoplastic particles include heat melting particles and heat fusible particles described below. Further, particles can be used which is obtained by dissolution or dispersion of light-to-heat conversion dyes described later in the thermoplastic particles.

(Heat Melting Particles)

The heat melting particles used in the invention are particularly particles having a low melt viscosity, or particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 150° C. lowers ink receptive sensitivity.

Materials usable in the invention include paraffin, polyolefin, polyethylene wax, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable. Among them, polyethylene, microcrystalline wax, fatty acid ester and fatty acid are preferably contained. A high sensitive image formation can be performed since these materials each have a relative low melting point and a low melt viscosity. These materials each have a lubrication ability, and therefore, even when a shearing force is applied to the surface layer of the printing plate precursor, the layer damage is minimized, and resistance to contaminations which may be caused by scratch is further enhanced.

The heat melting particles are preferably dispersible in water. The average particle size thereof is preferably from 0.01 to 10 μm, and more preferably from 0.1 to 3 μm. When a layer containing the heat melting particles is coated on the porous hydrophilic layer to be described later, the particles having an average particle size less than 0.01 μm may enter the pores of the hydrophilic layer or the valleys between the neighboring two peaks on the hydrophilic layer surface, resulting in insufficient development on press and background contaminations. The particles having an average particle size exceeding 10 μm are not preferred, since it may result in lowering of dissolving power.

The composition of the heat melting particles may be continuously varied from the interior to the surface of the particles. The particles may be covered with a different material. Known microcapsule production method or sol-gel method can be applied for covering the particles.

(Heat Fusible Particles)

The heat fusible particles in the invention include thermoplastic hydrophobic polymer particles. Although there is no specific limitation to the upper limit of the softening point of the thermoplastic hydrophobic polymer particles, the softening point is preferably lower than the decomposition temperature of the polymer particles. The weight average molecular weight (Mw) of the polymer is preferably within the range of from 10,000 to 1,000,000.

Examples of the polymer consisting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co)polymer or a (meth)acrylic acid (co)polymer such as polymethyl methacrylate, a methyl methacrylate-(2-ethylhexyl)acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used. Hydrophobic polymer particles containing nitrogen in an amount of more than 0.1% by weight, disclosed in Japanese Patent O.P.I. Publication Nos. 2002-251005, can be preferably used.

The polymer particles may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The heat fusible particles are preferably dispersible in water. The average particle size of the heat fusible particles is preferably from 0.01 to 10 μm, and more preferably from 0.1 to 3 μm. When a layer containing the heat fusible particles having an average particle size less than 0.01 μm is coated on the porous hydrophilic layer, the particles may enter the pores of the hydrophilic layer or the valleys between the neighboring two peaks on the hydrophilic layer surface, resulting in insufficient development on press and background contaminations. The heat fusible particles having an average particle size exceeding 10 μm may result in lowering of dissolving power.

Further, the composition of the heat fusible particles may be continuously varied from the interior to the surface of the particles. The particles may be covered with a different material. As a covering method, known methods such as a microcapsule method and a sol-gel method are usable.

The thermoplastic particle (heat melting particle or heat fusible particle) content of the image formation layer is preferably 1 to 90% by weight, and more preferably 5 to 80% by weight based on the total layer weight.

(Light-to-Heat Conversion Dyes)

In the invention, various known compounds can be used as the light-to-heat conversion dyes.

The light-to-heat conversion dyes include general infrared absorbing dyes.

Examples of the general infrared absorbing dyes include a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-to-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589, 3-103476, 11-240270, 11-309952, 11-265062, 2000-1060, 2000-309174, 2001-152965, 2002-144750, and 2001-219667. These compounds may be used singly or in combination.

Compounds disclosed in Japanese Patent O.P.I. Publication Nos. 11-240270, 11-265062, 2002-309174, 2002-49147, 2001-162965, 2002-144750, 2001-219667 can be preferably used as light-to-heat conversion dyes.

The light-to-heat conversion dyes (hereinafter referred to as light-to-heat conversion dyes in the invention) used in the image formation layer are preferably water soluble infrared absorbing dyes having an absorption maximum of from 700 to 1200, and preferably from 780 to 900 nm. The light-to-heat conversion dyes in the invention are more preferably cyanine dyes having an absorption maximum of from 700 to 1200, and preferably from 780 to 900 nm. The content of the light-to-heat conversion dye in the invention in the image formation layer is preferably from 0.01 to 20% by weight, and more preferably from 0.1 or 10% by weight. Examples of such dyes will be listed below, but are not limited thereto.

(IR-1)

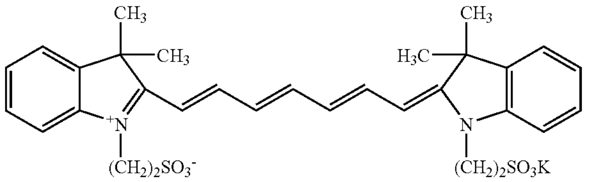

(IR-2)

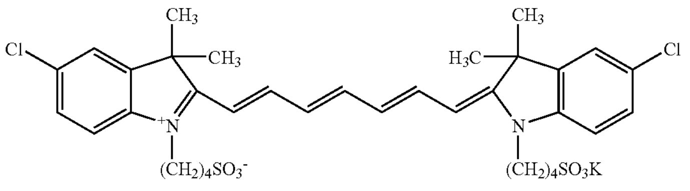

-continued
(IR-3)
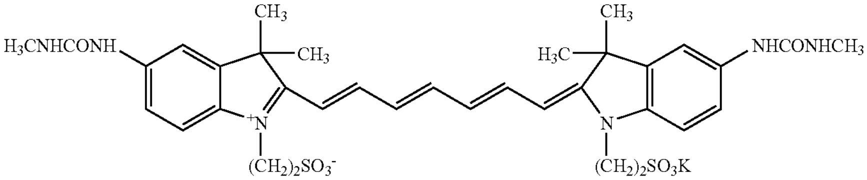
(IR-4)
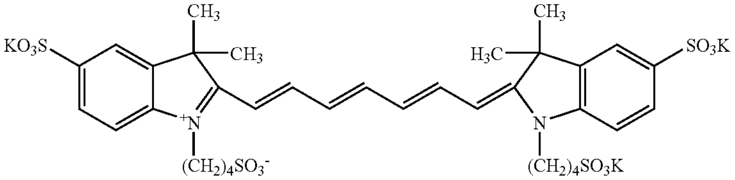
(IR-5)
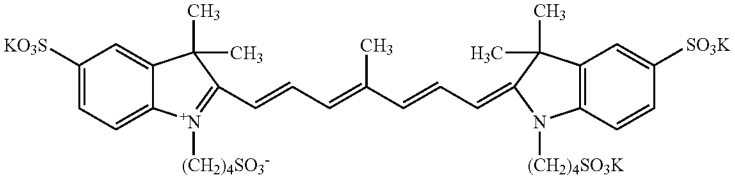
(IR-6)
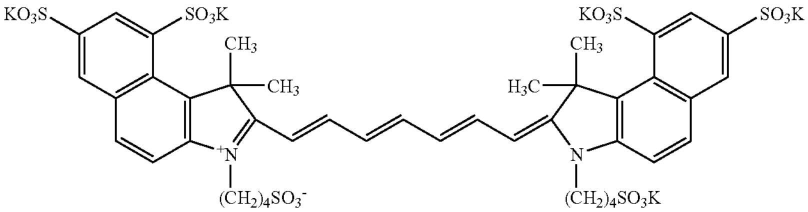
(IR-7)
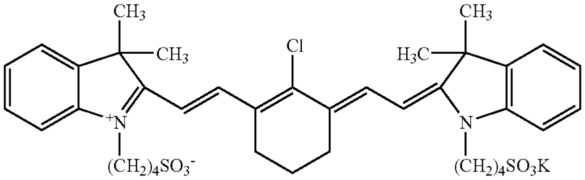
(IR-8)
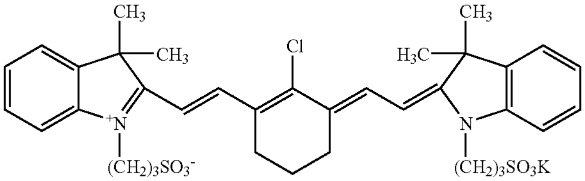
(IR-9)
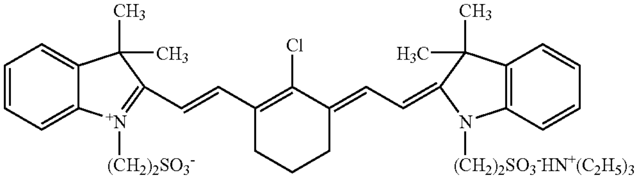
(IR-10)
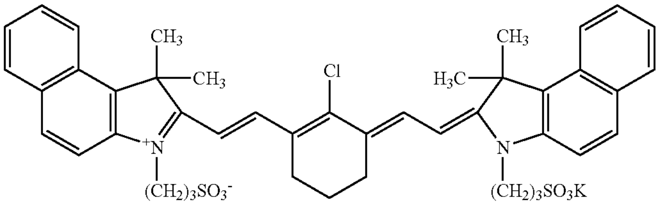

-continued
(IR-11)
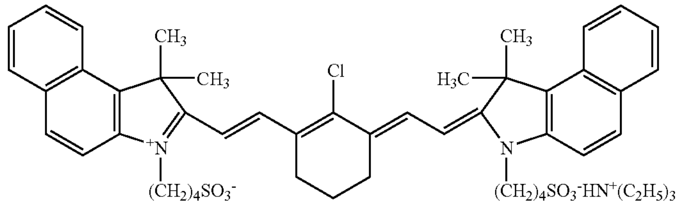
(IR-12)
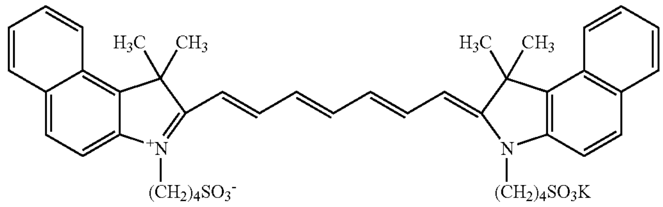
(IR-13)
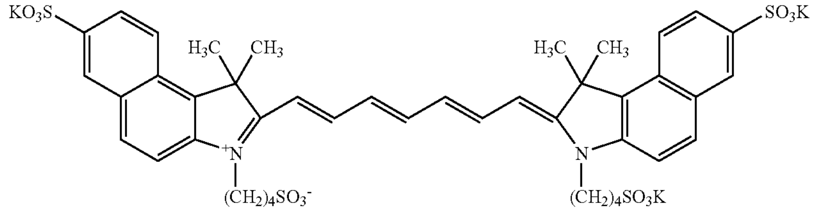
(IR-14)
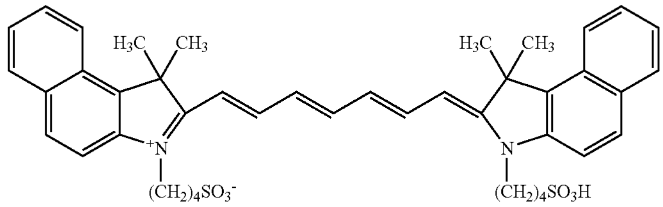
(IR-15)
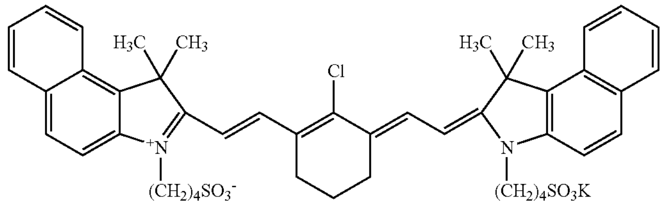
(IR-16)
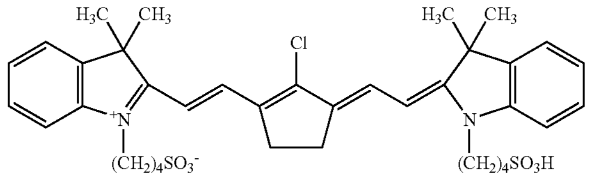
(IR-17)
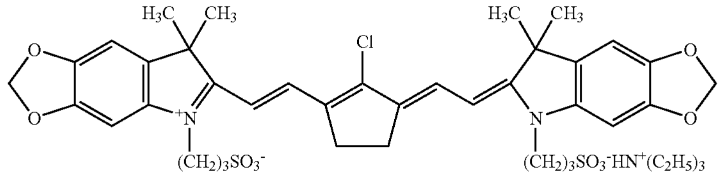

-continued
(IR-18)
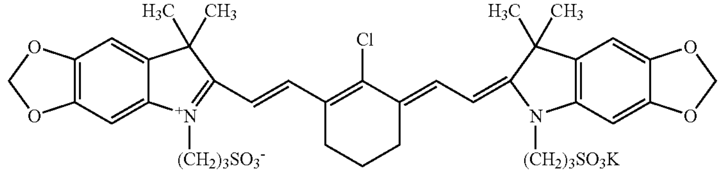
(IR-19)
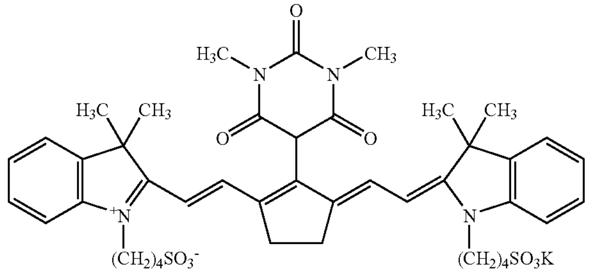
(IR-20)
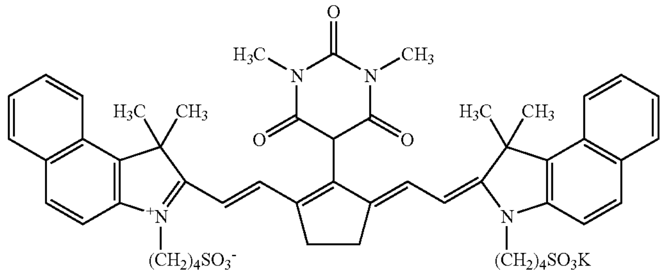
When light-to-heat conversion dyes are contained in the heat melting particles, they are preferably oleophilic light-to-heat conversion dyes. Examples of such dyes will be listed below.
(IR-21)
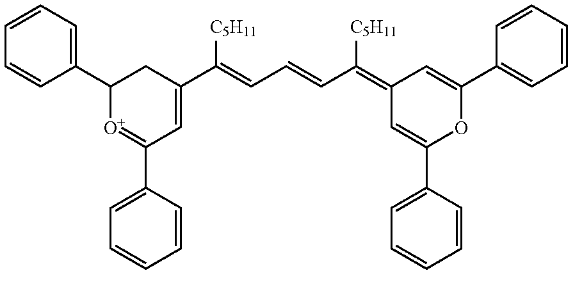
$ClO_4^-$
(IR-22)
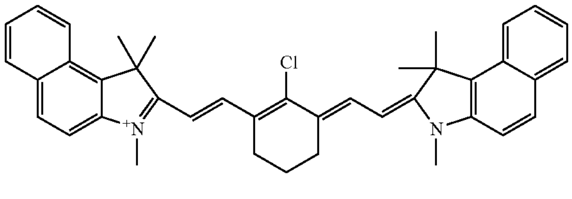
$ClO_4^-$
-continued
(IR-23)
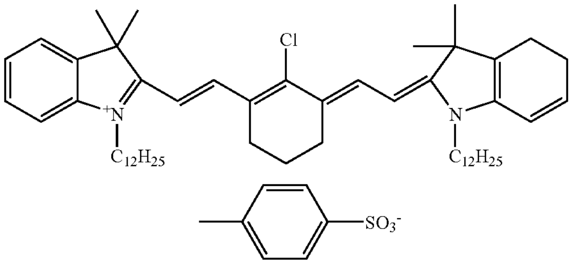
(IR-24)
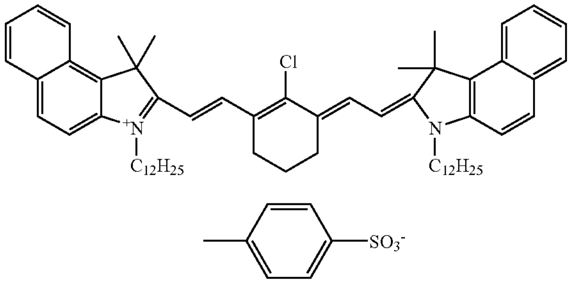

-continued
(IR-25)
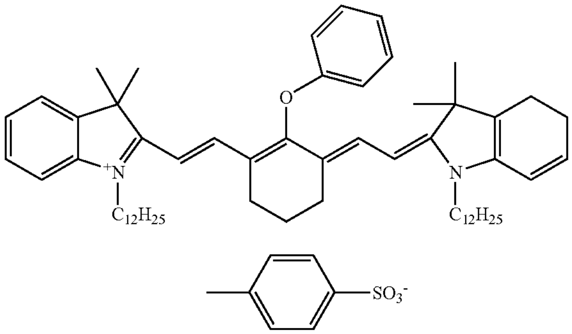
(IR-26)
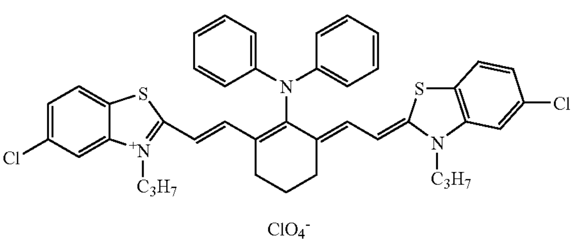
(IR-27)
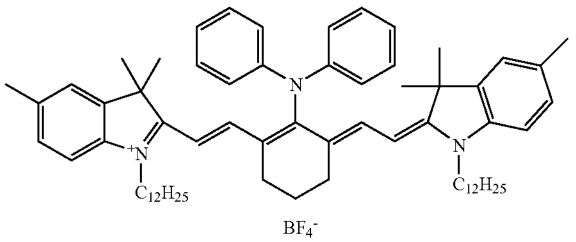
(IR-28)
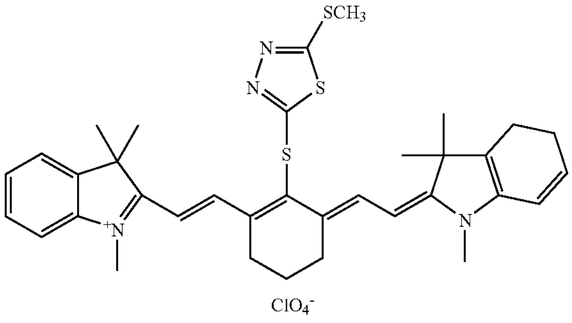
(IR-29)
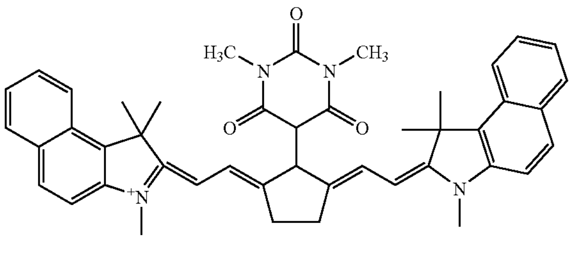
-continued
(IR-30)
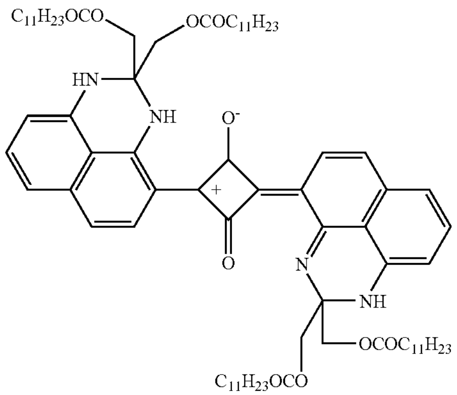
(IR-31)
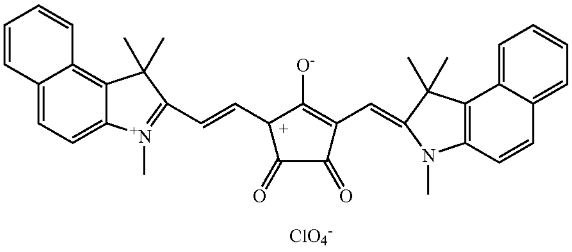
(IR-32)
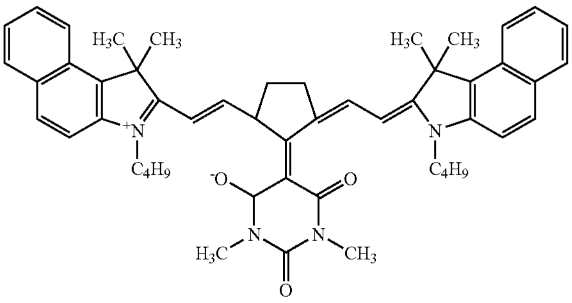
(IR-33)
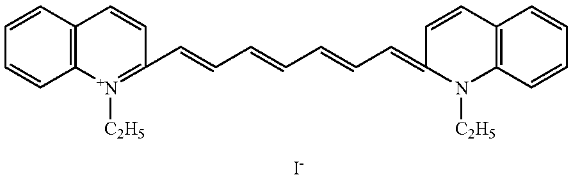
(IR-34)
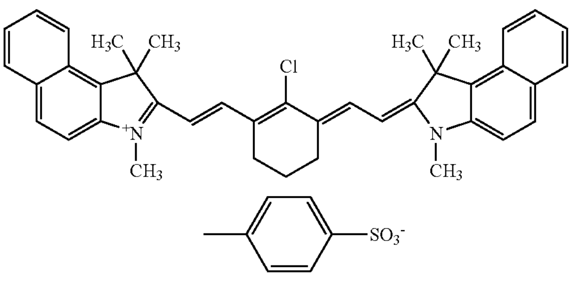

-continued (IR-35)

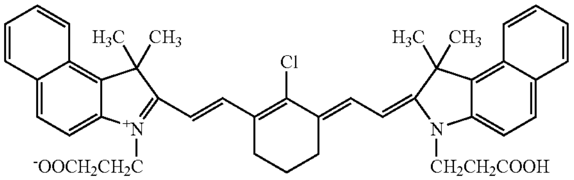

(IR-36)

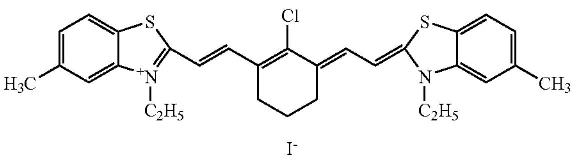

(IR-37)

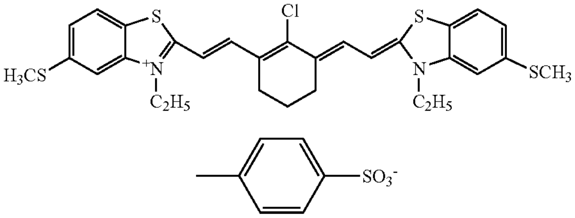

(IR-38)

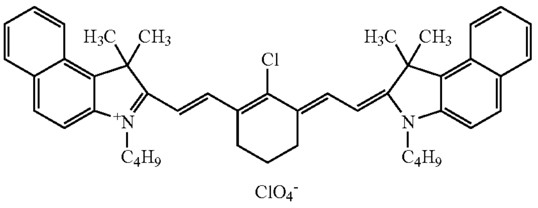

(IR-39)

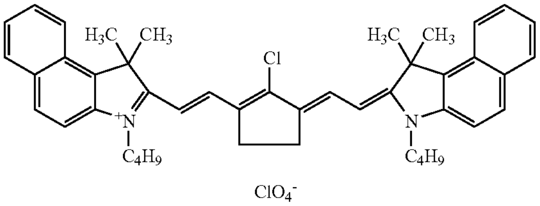

(IR-40)

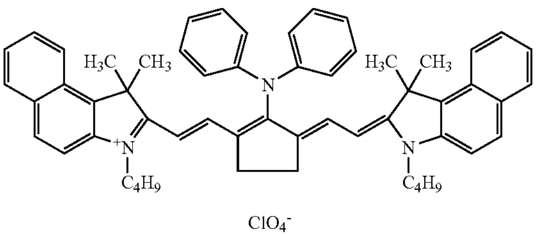

-continued (IR-41)

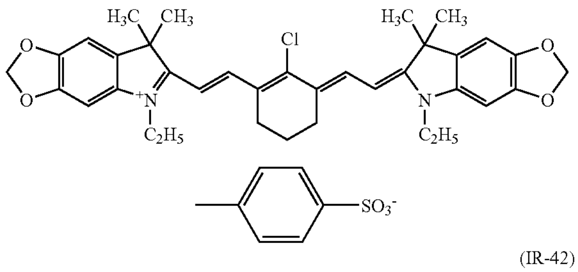

(IR-42)

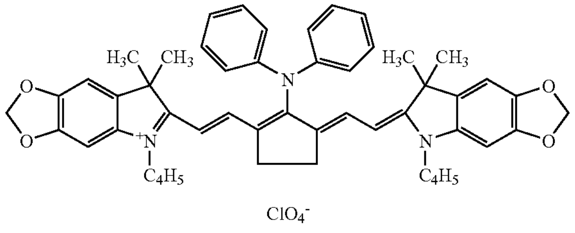

(IR-43)

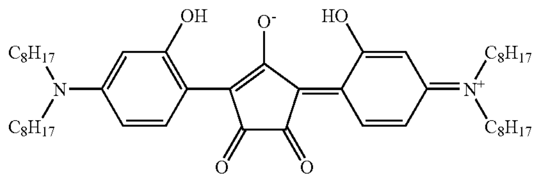

It is preferred in the invention that the light-to-heat conversion dye changes in color due to infrared laser exposure, resulting in exposure visualization, whereby color of the image formation layer at the unexposed portions is discriminated from that at the exposed portions. Therefore, the light-to-heat conversion dye is preferably a dye having a function of color-fading by heating or discoloring by action of an acid or an alkali. Examples of such a dye include those disclosed in Japanese Patent O.P.I. Publication No. 11-240270, but the dye may be any dye as long as it has the function described above.

(Other Light-to-heat Conversion Materials)

In the invention, other light-to-heat conversion materials can be used in addition to the light-to-heat conversion dye described above. Examples of other light-to-heat conversion materials are preferably carbon, graphite, a metal and a metal oxide.

Furnace black and acetylene black is preferably used as the carbon. The graininess ($d_{50}$) thereof is preferably not more than 100 nm, and more preferably not more than 50 nm. The graphite is one having a particle size of preferably not more than 0.5 μm, more preferably not more than 100 nm, and most preferably not more than 50 nm. As the metal, any metal can be used as long as the metal is in a form of fine particles having preferably a particle size of not more than 0.5 μm, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials which are electro-conductive or semi-conductive can be used. Examples of the former include black iron oxide ($Fe_3O_4$), and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. The particle size of these particles is preferably not more than 0.5 μm, more preferably not more than 100 nm, and most preferably not more than 50 nm.

Among these light-to-heat conversion materials, black complex metal oxides containing at least two metals are preferred. Typically, the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light heat conversion efficiency as compared with another metal oxide.

The primary average particle size of these complex metal oxides is preferably from 0.001 to 1.0 μm, and more preferably from 0.01 to 0.5 μm. The primary average particle size of from 0.001 to 1.0 μm improves light heat conversion efficiency relative to the addition amount of the particles, and the primary average particle size of from 0.05 to 0.5 μm further improves a light heat conversion efficiency relative to the addition amount of the particles. The light heat conversion efficiency relative to the addition amount of the particles depends on a dispersity of the particles, and the well-dispersed particles have a high light heat conversion efficiency. Accordingly, these complex metal oxide particles are preferably dispersed according to a known dispersing method, separately to a dispersion liquid (paste), before being added to a coating liquid for the particle containing layer. The metal oxides having a primary average particle size of less than 0.001 are not preferred since they are difficult to disperse. A dispersant is optionally used for dispersion. The addition amount of the dispersant is preferably from 0.01 to 5.0% by weight, and more preferably from 0.1 to 2.0% by weight, based on the weight of the complex metal oxide particles.

(Materials Providing Exposure Visualization Function)

In the invention, the materials providing exposure visualization function include a combination of known materials, mixture 1 or 2 described below.

Mixture 1: an electron providing dye precursor and an electron accepting developing agent Mixture 2: a discoloring dye changing its color by the action of an acid or a radical and an acid generating agent or a radical generating agent Mixture 1 above will be explained below.

<Electron Providing Dye Precursor>

As the electron providing dye precursor, known precursors, which are used in a conventional thermal recording paper, can be used. Examples of the electron providing dye precursor include a triarylmethane compound such as crystal violet lactone, a diphenylmethane compound such as leuco auramine, a spiropyran compound, a fluoran compound, a rhodamine lactam compound, and a carbazolylmethane compound. Further, compounds represented by formula (1) disclosed in Japanese Patent O.P.I. Publication No. 6-210947 can be used as the electron providing dye precursor.

It is preferred that the electron providing dye precursor is dispersed in the image formation layer in the form of particles. The average particle size of the electron providing dye precursor particles is from 0.01 to 10 μm, preferably from 0.05 to 5.0 μm, and more preferably from 0.1 to 2.0 μm.

The electron providing dye precursor particles can be obtained as an aqueous electron providing dye precursor dispersion, which is prepared by a known wet dispersion method, for example, by dispersing the electron providing dye precursor with a dispersant in a sand grinder. Examples of the dispersant include known (nonionic or anionic) surfactants and water soluble polymers. Among the water soluble polymers, methylcellulose, carboxymethylcellulose, hydroxypropylmethylcellulose, polyethylene glycol, polyethylene glycol fatty acid ester, polyoxyethylenealkylether sulfate, and 2-ethylhexylsulfosuccinate sodium salt are preferred.

<Electron Accepting Developing Agent>

As the electron accepting developing agent, known developing agents, which are used in a conventional thermal recording paper and disclosed in Japanese Patent O.P.I. Publication Nos. 6-99663, 7-52551, and 8-258420, are preferably used. For example, acidic compounds such as a phenol compound, a thiophenol compound, a thiourea derivative, an organic acid or its metal salt, and oxyesters are preferably used. Examples thereof include bisphenols such as 2,2-bis(4'-hydroxyphenyl)propane (called bisphenol A), 2,2-bis(4'-hydroxyphenyl)pentane, 2,2-bis(4'-hydroxy-3',5'-dichlorophenyl)propane, 1,1-bis(4'-hydroxyphenyl)cyclohexane, 2,2-bis(4'-hydroxyphenyl)hexane, 1,1-bis(4'-hydroxyphenyl)propane, 1,1-bis(4'-hydroxyphenyl)butane, 1,1bis(4'-hydroxyphenyl)pentane, 1,1-bis(4'-hydroxyphenyl)hexane, 1,1-bis(4'-hydroxyphenyl)heptane, 1,1bis(4'-hydroxyphenyl)octane, 1,1-bis(4'-hydroxyphenyl)-2-methylpentane, 1,1-bis(4'-hydroxyphenyl)-2-ethylhexane, 1,1-bis(4'-hydroxyphenyl)dodecane, 1,4-bis(p-hydroxyphenylcumyl)benzene, 1,3-bis(p-hydroxyphenylcumyl)benzene, bis(p-hydroxyphenyl) sulfone, bis(3-allyl-4-hydroxyphenyl)sulfone, and bis(p-hydroxyphenyl)acetic acid benzyl ester; salicylic acid derivatives such as 3,5-di-α-methylbenzylsalicylic acid, 3,5-di-t-butylsalicylic acid, 3-α,α-dimethylbenzylsalicylic acid, 4-(β-p-dimethoxyphenoxyethoxy)salicylic acid and their polyvalent metal (particularly, zinc, aluminum is preferred) salts; oxybenzoic acid esters such as p-hydroxybenzoic acid benzyl ester, p-hydroxybenzoic acid 2-ethylhexyl ester, and β-resorcylic acid-(2-phenoxyethyl) ester; and phenols such as p-phenylphenol, 3,5-diphenylphenol, cumylphenol, 4-hydroxy-4'-isopropoxy-diphenyl sulfone, and 4-hydroxy-4'-phenoxy-diphenyl sulfone, but are not limited thereto.

The electron accepting developing agent has a melting point of preferably from 50 to 300° C., and more preferably from 100 to 200° C.

It is preferred that the electron accepting developing agent can be also dispersed in the image formation layer in the form of particles, as in the electron providing dye precursor above.

Mixture 2 will be explained below.

<Acid Generating Agent or Radical Generating Agent>

In the invention, agents generating an acid or a radical on application of heat are preferably halomethyl compounds, more preferably halomethyl compounds generating an acid or a radical on application of heat without substantially absorbing light having a visible wavelength range (from 400 to 700 nm), still more preferably a compound represented by the following formula 1 or 2.

Among these, a trihalomethyl-containing compound is most preferred.

Formula 1

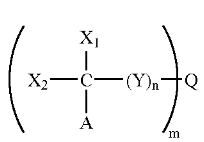

In formula 1 above, $X_1$ and $X_2$ independently represent a halogen atom; A represents a hydrogen atom, a halogen atom or an electron withdrawing group; Y represents —SO—, —CO—, —$SO_2$—, —$SO_2$—O—, —N($R_{11}$)—, —COCO—, —SCO—, —SCOO—, —COO—, —OCOO—, —OCO—, —C($Z_1$)($Z_2$)-, an alkylene group, an arylene group, a divalent heterocyclic group, or a divalent group derived from their combination, in which $R_{11}$ represents a hydrogen atom, an alkyl group or $R_{12}$ in which $R_{12}$ represents —(Y)n-C($X_1$)($X_2$)(A) and n represents an integer from 1 to 20, and in which $Z_1$ and $Z_2$ independently represent a hydrogen atom, a halogen atom or an electron withdrawing group, provided that $Z_1$ and $Z_2$ are not simultaneously hydrogen atoms; Q represents a heterocyclic group, an aryl group, or an aliphatic group, provided that when Y represents —SO—, Q represents an aryl group, a 5-membered aromatic heterocyclic group containing a heteroatom other than a nitrogen atom, or a pyridyl group; and m represents an integer of 3 or 4.

The halogen atom represented by formula $X_1$ or $X_2$ may be the same as or different from each other, and represents a fluorine atom, a chlorine atom, a bromine atom or an iodine atom, a chlorine atom, a bromine atom or an iodine atom, more preferably a chlorine atom, or a bromine atom, and most preferably a bromine atom. Y is preferably —$SO_2$—, —$SO_2$O—. —N($R_{11}$)—, —SO—, or —CO— or their combination. n is preferably 1. $R_{11}$ is preferably a hydrogen atom. The electron-withdrawing group represented by $Z_1$, or $Z_2$ is a group exhibiting a σp value of preferably not less than 0.01 and more preferably not less than 0.1. Hammett substituent constant (σp) is detailed in Journal of Medicinal Chemistry, 1973, Vol. 16, No. 11, 1207 to 1216.

Examples of the electron-withdrawing group include a halogen atom {e.g., a fluorine atom (a σp value of 0.06), a chlorine atom (a σp value of 0.23), a bromine atom (a σp value of 0.23), an iodine atom (a σp value of 0.18)}, a trihalomethyl group {e.g., tribromomethyl (a σp value of 0.29), trichloromethyl (a σp value of 0.33), trifluoeomethyl (a σp value of 0.54)}, a cyano group (a σp value of 0.66), a nitro group (a σp value of 0.78), an aliphatic, aryl or heterocyclic sulfonyl group {e.g., a methane sulfonyl group (a σp value of 0.72)}, an aliphatic, aryl or heterocyclic acyl group {e.g., acetyl (a σp value of 0.50), benzoyl (a σp value of 0.43)}, an ethinyl group (a σp value of 0.09), an aliphatic, aryl or heterocyclic oxycarbonyl group {e.g., methoxycarbonyl (a σp value of 0.45), phenoxycarbonyl (a σp value of 0.45)}, a carbamoyl group (a σp value of 0.36), and a sulfamoyl group (a σp value of 0.57).

$Z_1$ and $Z_2$ each are preferably a halogen atom, a cyano group or a nitro group. The halogen atom is preferably a chlorine atom, a bromine atom or an iodine atom, more preferably a chlorine or bromine atom, and still more preferably a bromine atom.

The electron withdrawing group represented by A is a group exhibiting a σp value of preferably not less than 0.01 and more preferably not less than 0.1.

Examples of such an electron-withdrawing group include a trihalomethyl group {e.g., tribromomethyl (a σp value of 0.29), trichloromethyl (a σp value of 0.33), trifluoeomethyl (a σp value of 0.54)}, a cyano group (a σp value of 0.66), a nitro group (a σp value of 0.78), an aliphatic, aryl or heterocyclic sulfonyl group {e.g., a methane sulfonyl group (a σp value of 0.72)}, an aliphatic, aryl or heterocyclic acyl group {e.g., acetyl (a σp value of 0.50), benzoyl (a σp value of 0.43)}, an ethinyl group (a σp value of 0.09), an aliphatic, aryl or heterocyclic oxycarbonyl group {e.g., methoxycarbonyl (a σp value of 0.45), phenoxycarbonyl (a σp value of 0.45)}, a carbamoyl group (a σp value of 0.36), and a sulfamoyl group (a σp value of 0.57). Further, a halogen atom {e.g., a fluorine atom (a σp value of 0.06), a chlorine atom (a σp value of 0.23), a bromine atom (a σp value of 0.23), an iodine atom (a σp value of 0.18)} is preferred as the electron-withdrawing group.

A is preferably an electron-withdrawing group, more preferably a halogen atom, an aliphatic, aryl or heterocyclic sulfonyl group, an aliphatic, aryl or heterocyclic acyl group, or an aliphatic, aryl or heterocyclic oxycarbonyl group, and still more preferably a halogen atom. The halogen atom is preferably a chlorine atom, a bromine atom or an iodine atom, more preferably a chlorine or bromine atom, and still more preferably a bromine atom.

Q represents a heterocyclic group, an aryl group, or an aliphatic group, provided that when Y represents —SO—, Q represents a 5-membered aromatic heterocyclic group containing a heteroatom other than a nitrogen atom, or a pyridyl group. These ring groups may be condensed with another ring to form a condensed ring.

Examples of the 5-membered aromatic heterocyclic group containing a heteroatom other than a nitrogen atom include thiazolyl, oxazolyl, thienyl, furyl, pyrrolyl, thiadiazolyl, oxadiazolyl, thiatriazolyl, and oxatriazolyl. Q is preferably thiazolyl, pyridyl, or quinolinyl.

The aliphatic group represented by Q is a straight-chain, branched or cyclic alkyl group (preferably having 1 to 30 carbon atoms, more preferably 1 to 20 carbon atoms, and still more preferably 1 to 12 carbon atoms, such as methyl, ethyl, iso-propyl, tert-butyl, n-octyl, n-decyl, cyclopropyl, cyclopentyl and cyclohexyl), an alkenyl group (preferably having 2 to 30 carbon atoms, more preferably 2 to 20 carbon atoms, and still more preferably 2 to 12 carbon atoms, such as vinyl, allyl, 2-butenyl, 3-pentenyl), an alkynyl group (preferably having 2 to 30 carbon atoms, more preferably 2 to 20 carbon atoms, and still more preferably 2 to 12 carbon atoms, such as propargyl, 3-pentynyl), each of which may be substituted. Examples of the substituent group include a carboxyl group, an acyl group, an acylamino group, a sulfonylamino group, a carbamoyl group, an oxycarbonylamino group, and a ureido group. The aliphatic group represented by Q is preferably an alkyl group, and more preferably a straight-chained alkyl group.

The aryl group represented by Q is preferably an aryl group; the aryl group is preferably a mono-cyclic or dicyclic aryl group having 6 to 30 carbon atoms (e.g., phenyl, naphthyl), more preferably a phenyl group having 6 to 20 carbon atoms, and still more preferably a phenyl group having 6 to 12 carbon atoms. The aryl group may be substituted and examples of the substituent group include a carboxyl group, an acyl group, an acylamino group, a sulfonylamino group, a carbamoyl group, an oxycarbonylamino group, and a ureido group.

The heterocyclic group represented by Q is a heterocyclic group derived from a 3- to 10-membered saturated or unsaturated heterocyclic ring containing N, O or S, which may be a single ring or a condensed ring. The heterocyclic group is preferably a 5- or 6-member aromatic heterocyclic group, more preferably a 5- or 6-member aromatic heterocyclic group containing a nitrogen atom, and still more preferably a 5- or 6-member aromatic heterocyclic group containing one or two nitrogen atoms.

Examples of a heterocyclic ring, from which the heterocyclic group is derived, include pyrrolidine, piperidine, piperadine, morpholine, thiophene, furan, pyrrole, imidazole, pyrazolo, pyridine, pirazine, pyridazine, triazole, triazine, indole, indazole, purine, thiadiazole, oxadiazole, quinoline, phthalazine, naphthylidine, quinoquixaline, quinazolone, cinnoline, puteridine, acridine, phenazine, tetrazole, thiazole, oxazole, benzimidazole, benzoxazole, benzthiazole, and indolenine. Of these, thiophene, furan, pyrrole, imidazole, pyrazolo, pyridine, pyrazine, pyridazine, triazole, trazine, indole, indazole, quinoline, thiadiazole, oxadiazole, phthalazine, naphthylidine, quinoxaline, quinazolone, cinnolinepteridine, tetrazole, thiazole, oxazole, benzimidazole, benzoxazole, benzthiazole, and indolenine are preferred; pyridine, triazine, quinoline, thiadizole, benzthiazole, and oxadiazole are more preferred; and pyridine, quinoline, thiadiazole and oxadiazole are still more preferred. Preferred Q is an aromatic heterocyclic group containing nitrogen.

m is an integer of 3 or 4, and preferably an integer of 3. When Q is an aliphatic group, the number of halogen atoms contained in the molecule is preferably from 6 to less than 10, and more preferably 6.

Next, a compound represented by formula 2 will be explained.

Formula 2

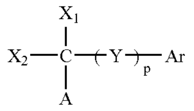

In formula 2 above, $X_1$ and $X_2$ independently represent a halogen atom; A represents a hydrogen atom, a halogen atom or an electron withdrawing group; Y represents —SO—, —CO—, —$SO_2$—, —$SO_2$—O—, N($R_{11}$)—, —COCO—, —SCO—, —SCOO—, —COO—, —OCOO—, —OCO—, —C($Z_1$) ($Z_2$)-, an alkylene group, an arylene group, a divalent heterocyclic group, or a divalent group derived from their combination, in which $R_{11}$ represents a hydrogen atom, an alkyl group or $R_{12}$ in which $R_{12}$ represents —$(Y)_n$-C($X_1$) ($X_2$) (A) and n represents an integer from 1 to 20, and in which $Z_1$ and $Z_2$ independently represent a hydrogen atom, a halogen atom or an electron withdrawing group, provided that $Z_1$ and $Z_2$ are not simultaneously hydrogen atoms; Ar represents an aryl group, an aliphatic group or a heterocyclic group; and p is an integer of 0 or 1.

In formula 2, Examples of $X_1$, $X_2$ and A are the same as those denoted in formula 1 above. Y represents the same denoted above, and Y is preferably —$SO_2$—, —$SO_2$O—N($R_{11}$)—, —SO—, —CO—, or —C($Z_1$) ($Z_2$)—, and more preferably —$SO_2$—, —$SO_{2O}$—, —N($R_{11}$)—, —SO—, or —C($Z_1$) ($Z_2$)-. $R_{11}$ represents the same as denoted above, and preferably is hydrogen. $Z_1$ and $Z_2$ independently represent a hydrogen atom, a halogen atom or an electron withdrawing group, provided that $Z_1$ and $Z_2$ are not simultaneously hydrogen atoms. The electron-withdrawing group represented by $Z_1$ or $Z_2$ is a group exhibiting a σp value of preferably not less than 0.01 and more preferably not less than 0.1.

Preferred examples of the electron-withdrawing group include a halogen atom {e.g., a fluorine atom (a σp value of 0.06), a chlorine atom (a σp value of 0.23), a bromine atom (a σp value of 0.23), an iodine atom (a σp value of 0.18)}, a trihalomethyl group {e.g., tribromomethyl (a σp value of 0.29), trichloromethyl (a σp value of 0.33), trifluoeomethyl (a σp value of 0.54)}, a cyano group (a σp value of 0.66), a nitro group (a σp value of 0.78), an aliphatic, aryl or heterocyclic sulfonyl group {e.g., a methane sulfonyl group (a σp value of 0.72)}, an aliphatic, aryl or heterocyclic acyl group {e.g., acetyl (a σp value of 0.50), benzoyl (a σp value of 0.43)}, an ethinyl group (a σp value of 0.09), an aliphatic, aryl or heterocyclic oxycarbonyl group {e.g., methoxycarbonyl (a σp value of 0.45), phenoxycarbonyl (a σp value of 0.45)}, a carbamoyl group (a σp value of 0.36), and a sulfamoyl group (a σp value of 0.57).

$Z_1$ and $Z_2$ each are preferably a halogen atom, a cyano group or a nitro group. The halogen atom is preferably a chlorine atom, a bromine atom or an iodine atom, more preferably a chlorine or bromine atom, and still more preferably a bromine atom.

Ar represents the group denoted above. Ar is preferably an aryl group, and more preferably a phenyl group or a naphthyl group. Examples of the trihalomethyl-containing compound will be listed below.

R-1

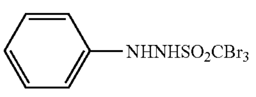

R-2

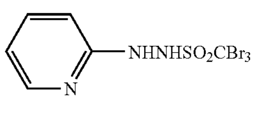

R-3

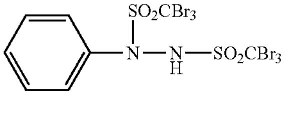

R-4

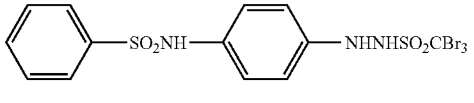

-continued
R-5
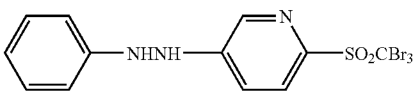
R-6
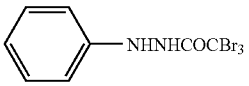
R-7
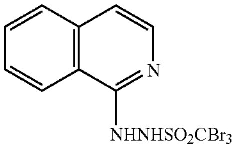
R-8
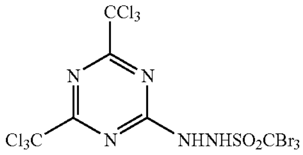
R-9
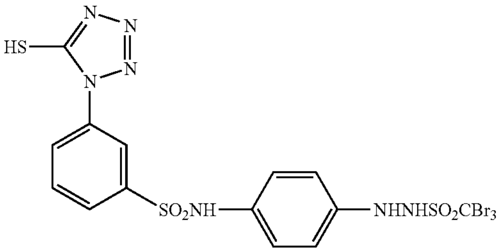
R-10
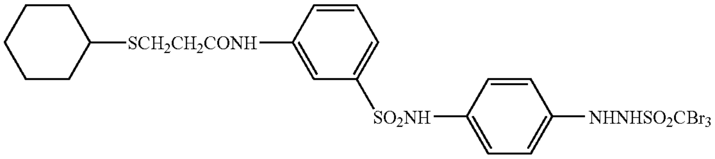
R-11
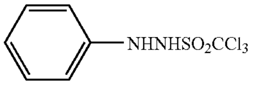
R-12
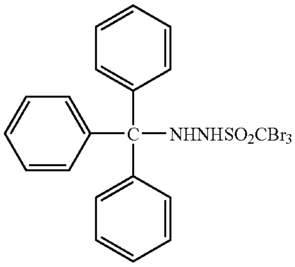
R-13
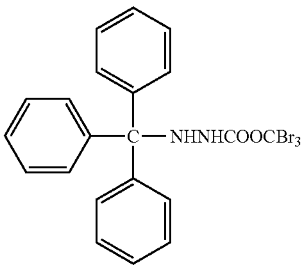
R-14
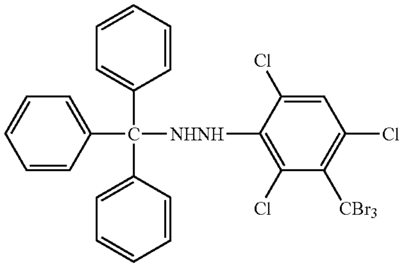
R-15
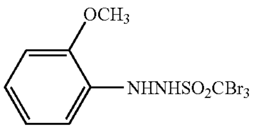
R-16
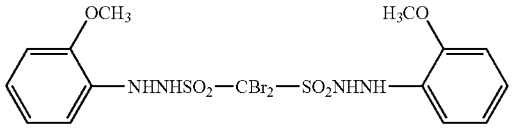

-continued
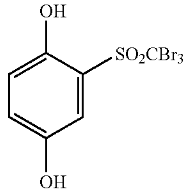
R-17
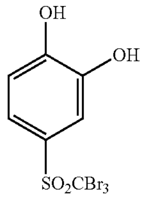
R-18
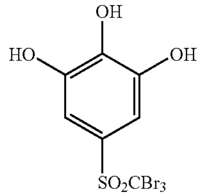
R-19
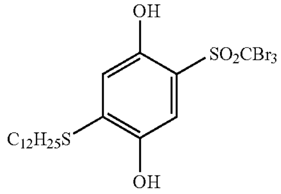
R-20
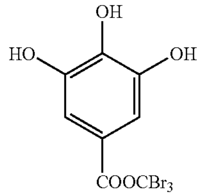
R-21
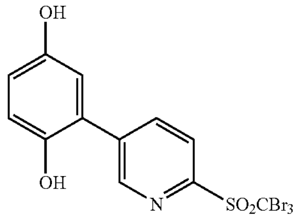
R-22
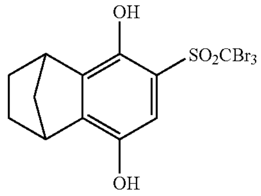
R-23
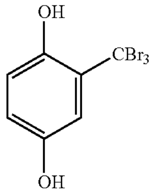
R-24
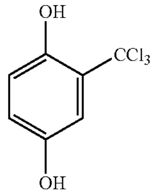
R-25
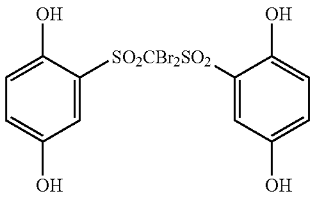
R-26
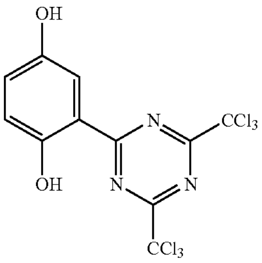
R-27
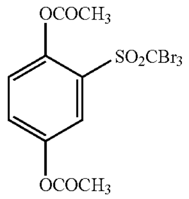
R-28

-continued
R-29
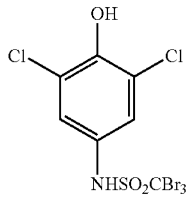
R-30
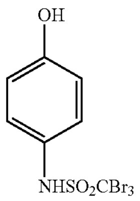
R-31
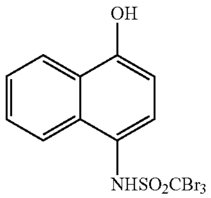
R-32
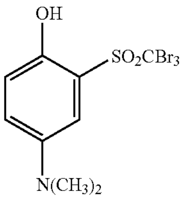
R-33
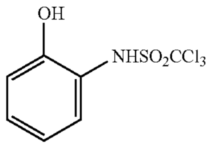
R-34
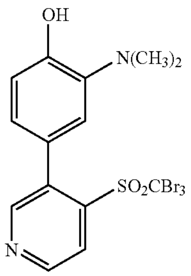
R-35
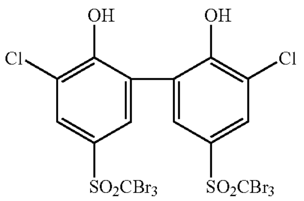
R-36
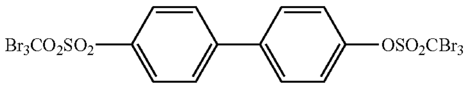
R-37
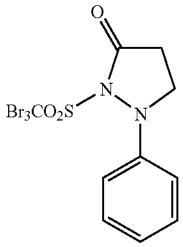
R-38
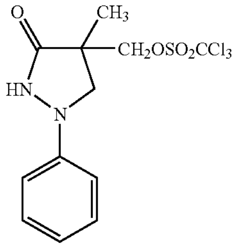
R-39
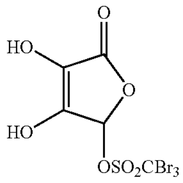
R-40
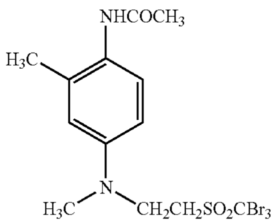

-continued
R-41
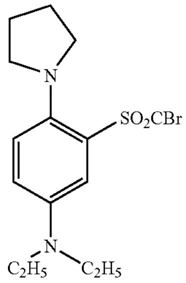
R-42
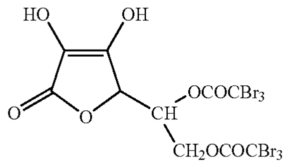
R-43
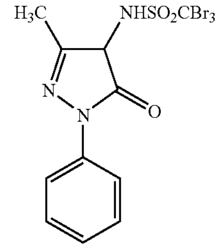
R-44
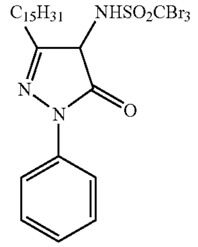
R-45
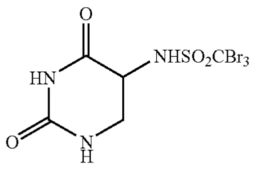
R-46
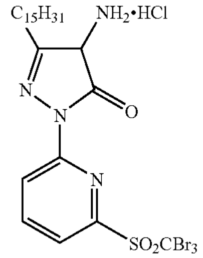
R-47
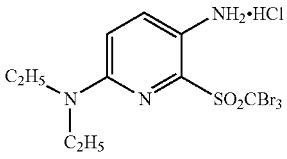
R-48
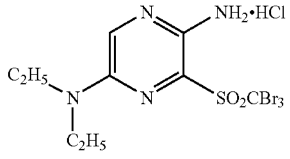
R-49
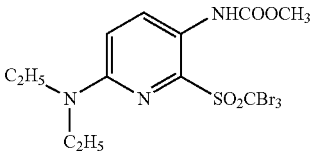
R-50
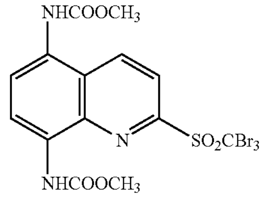
R-51
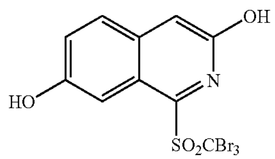
R-52
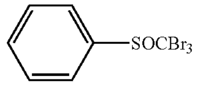

-continued
R-53
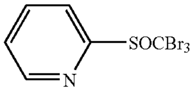
R-54
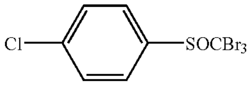
R-55
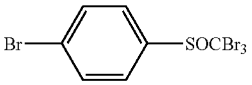
R-56
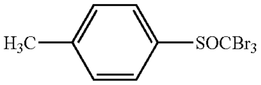
R-57
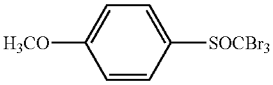
R-58
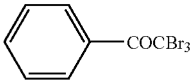
R-59
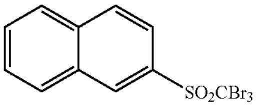
R-60
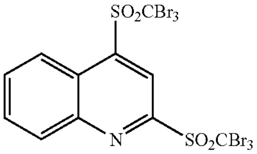
R-61
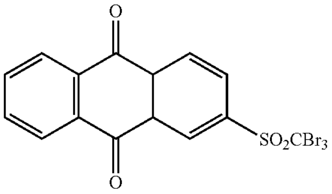
R-62
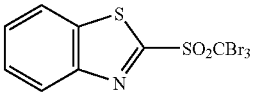
R-63
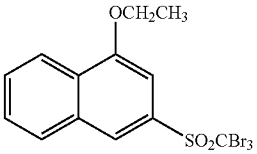
R-64
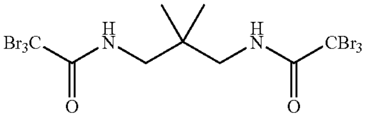
R-65
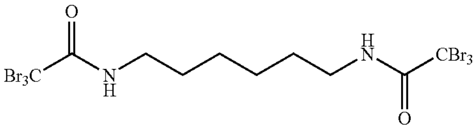
R-66
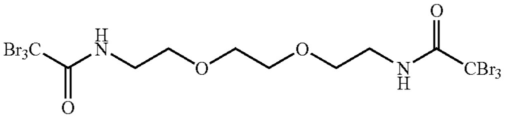
R-67
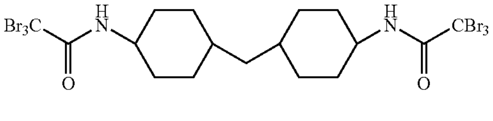
R-68
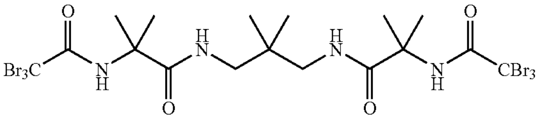
R-69
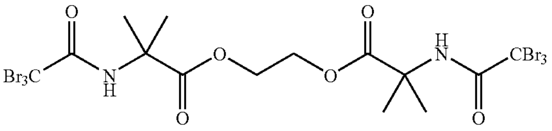
R-70
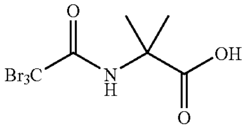

-continued
R-71
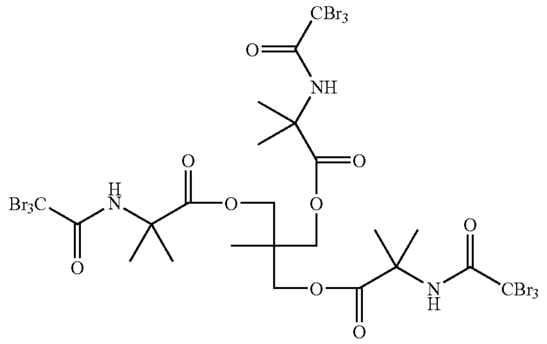
R-72
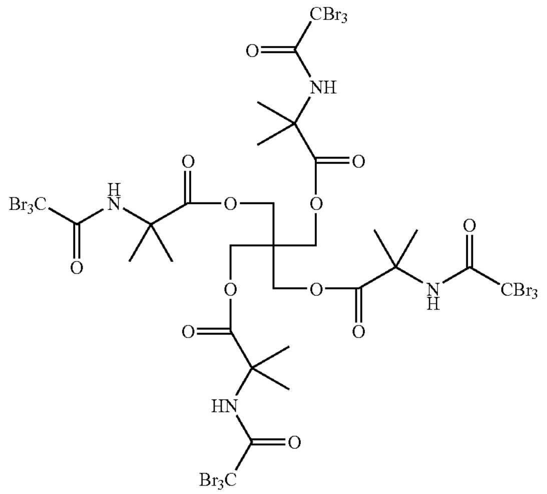
R-73
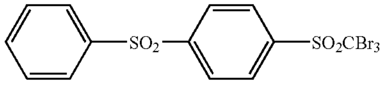
R-74
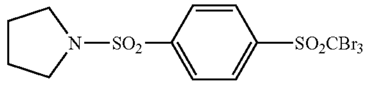
R-75
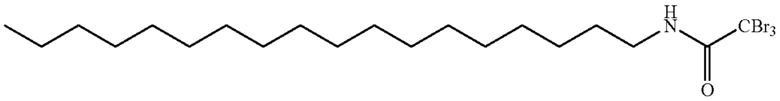
R-76
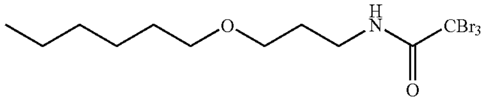
R-77
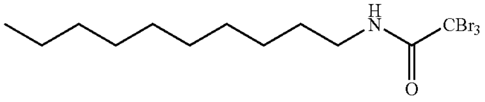
R-78
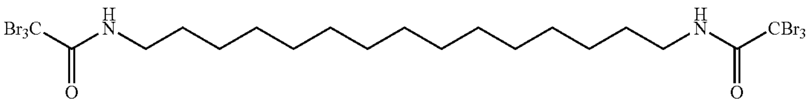
R-79
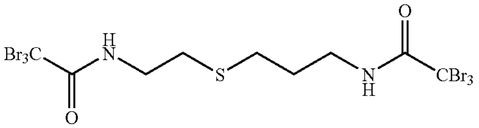

In the invention, the halomethyl compound can be synthesized according to a conventional method, and is available on the market.

The halomethyl compound in the invention can be dispersed in water according to a conventional method to obtain a dispersion of halomethyl compound, and can be incorporated in the image formation layer employing the dispersion. As a method to obtain heat melting particles containing the halomethyl compound, there is a method in which the halomethyl compound is dissolved in a resin constituting the heat melting particles, and then is dispersed in water in a disperser.

In the invention, the content of the halomethyl compound in the image formation layer is preferably from 0.2 to 10 mol, and more preferably from 0.5 to 5 mol, per mol of the discoloring dye contained in the image formation layer. The halomethyl compound has a melting point of preferably from 50 to 300° C., and more preferably from 80 to 250° C.

(Discoloring Dye Changing in Color by the Action of an Acid or a Radical)

In the invention, the discoloring dye changing its color by the action of an acid or a radical refers to one which does not substantially absorb light having a visible wavelength range (from 400 to 700 nm), but varies to absorb light having a visible wavelength range (from 400 to 700 nm) by the action of an acid or a radical. Preferred examples of the agent include dyes such as diphenylmethane dyes, triphenylmethane type thiazine dyes, thiazine dyes, oxazine dyes, xanthene dyes, anthraquinone dyes, iminonaphthoquinone dyes, azo dyes, and azomethine dyes.

Typical examples thereof include Briliant green, Ethyl violet, Methyl green, Crystal violet, Basic fuchsine, Methyl violet 2B, Quinardine red, Rose bengale, Metanil yellow, Thymolsulfophthalein, Xylenol blue, Methyl orange, Paramethyl red, Congo red, Benzopurpurin 4B, α-Naphthyl red, Nile blue 2B, Nile blue A, Methyl violet, Marachite green, Para-fuchsine, Victoria pure blue BOH (product of Hodogaya Kagaku), Oil blue #603 (product of Orient Kagaku kogyo), Oil pink #312 (product of Orient Kagaku kogyo), Oil red 5B (product of Orient Kagaku kogyo), Oil scarlet #308 (product of Orient Kagaku kogyo), Oil red OG (product of Orient kagaku kogyo), Oil red RR (product of Orient kagaku kogyo), Oil green #502 (product of Orient kagaku kogyo), Spiron red BEH special (product of Hodogaya Kagaku), m-Cresol purple, Cresol red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, 1-phenyl-3-methyl-4-p-diethylaminophenylimino-5-pyrazolone and 1-β-naphthyl-4-p-diethylaminophenylimino-5-pyrazolone.

As discoloring dyes, organic dyes such as aryl amines can be used. The aryl amines include leuco dyes as well as amines such as a primary aromatic amine and a secondary aromatic amine.

Examples thereof include diphenylamine, dibenzylaniline, triphenylamine, diethylaniline, diphenyl-p-phenylenediamine, p-toluidine, 4,4'-biphenyldiamine, o-chloroaniline, o-bromoaniline, 4-chloro-o-phenylenediamine, o-brom-N,N-dimethylaniline, 1,2,3-triphenylguanidine, naphthylamine, diaminodiphenylmethane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p',p"-hexamethyltriaminotriphenylmethane, p,p'-tetramethyldiaminotriphenylmethane, p,p'-tetramethyldiaminodiphenylmethylimine, p,p',p"-triamino-o-methyltriphenylmethane, p,p',p"-triaminotriphenylcarbinol, p,p'-tetramethylaminodiphenyl-4-anilinonaphthylmethane, p,p',p"-triaminotriphenylmethane, and p,p',p"-hexapropyltriaminotriphenylmethane.

When the resin used in the image formation layer is an oleophilic resin such as cresol resin which is used in a conventional thermosensitive or pressure-sensitive paper, triphenylmethanelactone type leuco dyes can be used as dye precursors. Examples of such leuco dyes include crystal violet lactone, 3-diethylamino-7-chlorofluoran, 3-diethylamino-6-methyl-7-chlorofluoran, 2-(N-phenyl-N-methylamino)-6-(N-p-Tolyl-N-ethyl)aminofluoran, malachite green lactone, 3,3-bis(1-ethyl-2-methylol-3-yl)phthalide, 3-diethylamino-6-methyl-7-anilinofluoran, 2-anilino-3-methyl-6-(N-ethyl-p-toluidino)fluoran, 3-(N-cyclohexyl-N-methylamino)-6-methyl-7-anilinofluoran, and 3-piperidino-6-methyl-7-anilinofluoran.

Further, tris(4-dimethylaminophenyl)methane can be preferably used.

In the invention, the discoloring dye (the discoloring dye in the invention) changing its color by the action of an acid or a radical can be synthesized according to a conventional method, and is available on the market.

The discoloring dye in the invention can be dispersed in water according to a conventional method to obtain a dispersion of discoloring dye, and can be incorporated in the image formation layer employing the dispersion. As a method to obtain heat melting particles containing the discoloring dye in the invention, there is a method in which the discoloring dye is dissolved in a resin constituting the heat melting particles, and then is dispersed in water in a disperser.

The content of the discoloring dye in the invention in the image formation layer is preferably from 0.1 to 10% by weight, and more preferably from 0.5 to 7% by weight, based on the total weight of image formation layer. The content range above of the discoloring dye can provide excellent layer physical properties and a print out image (an image formed on light exposure) with good quality.

(Another Material Which May Be Contained in the Image Formation Layer)

The image formation layer in the invention may contain the material described below in addition to the materials described above.

A water soluble resin or a water dispersible resin may be contained in the image formation layer. Examples thereof include oligosaccharides, polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylic acid, polyacrylic acid salts, polyacrylamide, and polyvinyl pyrrolidone. Among these, oligosaccharides, polysaccharides or polyacrylic acid are preferred. Examples of the oligosaccharides include raffinose, trehalose, maltose, galactose, sucrose, and lactose. Among these, trehalose is preferred. Examples of the polysaccharides include starches, celluloses, polyuronic acid and pullulan. Among these, cellulose derivatives such as a methyl cellulose salt, a carboxymethyl cellulose salt and a hydroxyethyl cellulose salt are preferred, and a sodium or ammonium salt of carboxymethyl cellulose is more preferred. The polyacrylic acid has a molecular weight of preferably from 3,000 to 1,000,000, and more preferably from 5,000 to 500,000.

A water-soluble surfactant may be contained in the image formation layer in the invention. A silicon atom-containing surfactant and a fluorine atom-containing surfactant can be used. The silicon atom-containing surfactant is especially preferred in that it minimizes printing contamination. The content of the surfactant is preferably from 0.01 to 3.0% by weight, and more preferably from 0.03 to 1.0% by weight based on the total weight of the image formation layer (or the solid content of the coating liquid).

The image formation layer in the invention can contain an acid (phosphoric acid or acetic acid) or an alkali (sodium hydroxide, silicate, or phosphate) to adjust pH.

EXAMPLES

The present invention will be explained below employing examples, but is not limited thereto.

<<Preparation of Aluminum Support>>

(Preparation of Aluminum Support 1)

A 0.24 mm thick aluminum plate (1050, H16) was immersed in an aqueous 1% by weight sodium hydroxide solution at 50° C. to give an etching amount of 2 $g/m^2$, washed with water, immersed in an aqueous 0.1% by weight hydrochloric acid solution at 25° C. for 30 seconds to neutralize, and then washed with water.

Subsequently, the aluminum plate was subjected to an electrolytic surface-roughening treatment in an electrolytic solution containing 10 g/liter of hydrochloric acid and 0.5 g/liter of aluminum at a peak current density of 60 $A/dm^2$ employing an alternating current with a sine waveform, in which the distance between the plate surface and the electrode was 10 mm. The electrolytic surface-roughening treatment was divided into 12 treatments, in which the quantity of electricity used in one treatment (at a positive polarity) was 40 $C/dm^2$, and the total quantity of electricity used (at a positive polarity) was 480 $C/dm^2$. Standby time of 4 seconds, during which no surface-roughening treatment was carried out, was provided after each of the separate electrolytic surface-roughening treatments.

Subsequently, the resulting aluminum plate was immersed in an aqueous 1% by weight sodium hydroxide solution at 50° C. and etched to give an etching amount of 0.2 $g/m^2$, washed with water, neutralized in an aqueous 10% by weight sulfuric acid solution at 25° C. for 10 seconds, and washed with water. Subsequently, the aluminum plate was subjected to anodizing treatment in an aqueous 20% by weight sulfuric acid solution at a constant voltage of 20 V, in which a quantity of electricity of 150 $C/dm^2$ was supplied, and washed with water.

The washed surface of the plate was squeegeed, and the plate was immersed in an aqueous 2.0% by weight sodium bicarbonate solution at 50° C. for 30 seconds, washed with water, and dried at 80° C. for 5 minutes. The resulting plate was immersed in an aqueous 5.0% by weight citric acid solution at 75° C. for 30 seconds, washed with water, and dried at 80° C. for 5 minutes. Thus, the aluminum support 1 was obtained.

The surface roughness of the aluminum support 1 was determined at a magnifying power of 40 employing a surface roughness measuring apparatus RSTPLUS, manufactured by WYKO Co., Ltd. The aluminum support 1 had a surface roughness Ra of 0.57 μm.

(Preparation of Aluminum Support 2)

Aluminum support 2 was prepared in the same manner as in aluminum support 1 above, except that the aluminum plate after the electrolytic surface-roughening treatment was etched to give an etching amount of 0.5 $g/m^2$. The aluminum support 2 had a surface roughness Ra of 0.55 μm.

(Preparation of Aluminum Support 3)

Aluminum support 3 was prepared in the same manner as in aluminum support 1 above, except that the aluminum plate after the electrolytic surface-roughening treatment was etched to give an etching amount of 1.0 $g/m^2$. The aluminum support 3 had a surface roughness Ra of 0.54 μm.

(Preparation of Aluminum Support 4)

Aluminum support 4 was prepared in the same manner as in aluminum support 1 above, except that the aluminum plate after the electrolytic surface-roughening treatment was etched to give an etching amount of 1.5 $g/m^2$. The aluminum support 4 had a surface roughness Ra of 0.53 μm.

(Preparation of Aluminum Support 5)

A 0.24 mm thick aluminum plate (1050, H16) was brush grained according to a conventional method, employing a 400 mesh volcanic ash as an abrasive and a nylon brush, immersed in an aqueous 1% by weight sodium hydroxide solution at 50° C. to give an etching amount of 4 $g/m^2$, washed with water, immersed in an aqueous 0.1% by weight hydrochloric acid solution at 25° C. for 30 seconds to neutralize, and then washed with water.

The resulting plate was treated in the same manner as in aluminum support 3, except that the electrolytic surface-roughening treatment was divided into 3 treatments, in which the quantity of electricity used in one treatment (at a positive polarity) was 60 $C/dm^2$, and the total quantity of electricity used (at a positive polarity) was 180 $C/dm^2$.

Thus, the aluminum support 5 was prepared. The aluminum support 5 had a surface roughness Ra of 0.62 μm.

(Preparation of Aluminum Support 6)

Aluminum support 6 was prepared in the same manner as in the aluminum support 3 above, except that the aluminum plate after the anodizing treatment was immersed in an aqueous 0.2% by weight polyvinyl phosphonic acid solution at 75° C. for 30 seconds, washed with water, and dried at 80° C. for 5 minutes. The aluminum support 6 had the same surface roughness Ra as the aluminum support 3.

(Preparation of Aluminum Support 7)

Aluminum support 7 was prepared in the same manner as in the aluminum support 3 above, except that the aluminum plate after the anodizing treatment was immersed in an aqueous 0.5% by weight sodium dihydrogenphosphate solution at 70° C. for 30 seconds, washed with water, and dried at 80° C. for 5 minutes.

The aluminum support 7 had the same surface roughness Ra as the aluminum support 3.

(Preparation of Aluminum Support 8)

Aluminum support 8 was prepared in the same manner as in the aluminum support 3 above, except that the aluminum plate after the anodizing treatment was immersed in an aqueous 0.5% by weight sodium silicate (No. 3) solution at 70° C. for 30 seconds, washed with water, and dried at 80° C. for 5 minutes. The aluminum support 8 had the same surface roughness Ra as the aluminum support 3.

(Preparation of Aluminum Support 9 (Comparative))

Aluminum support 9 was prepared in the same manner as in the aluminum support 1 above, except that the aluminum plate after the electrolytic surface-roughening treatment was immersed in an aqueous 20% by weight sulfuric acid solution at 60° C. for 120 seconds, etched, and washed with water, but was not subjected to neutralization treatment. The aluminum support 9 had a surface roughness Ra of 0.57 μm.

(Preparation of Aluminum Support 10 (Comparative))

Aluminum support 10 was prepared in the same manner as in the aluminum support 5 above, except that the aluminum plate after the electrolytic surface-roughening treatment was immersed in an aqueous 20% by weight sulfuric acid solution at 60° C. for 120 seconds, etched, and washed with water, but was not subjected to neutralization treatment. The aluminum support 10 had a surface roughness Ra of 0.64 μm.

<<Preparation of Image Formation Layer Coating Liquid>>

(Preparation of Acid Generating Agent Dispersion)

An acid generating agent having a chemical structure as shown below of 15 g, 30 g of an aqueous 10% by weight polyvinyl alcohol (PVA117, produced by Kuraray Co., Ltd.) solution, 1.0 g of ethanol and 24 g of pure water were mixed and dispersed in a sand grinder for 3 hours, where zirconia beads were used as a dispersant, and the dispersion rotation number was 4000 rpm. The resulting mixture was diluted with water to give a solid content of 10% by weight, and filtered. Thus, an acid generating agent dispersion was prepared.

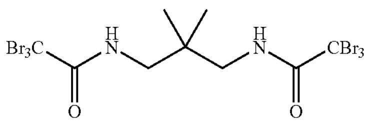

(Preparation of Image Formation Layer Coating Liquid)

The image formation layer coating liquid A through H as shown in Table 1 were prepared.

Details of the additives in Table 1 are as follows.

Additive 1: Carnauba wax emulsion A118 (the wax having an average particle size of 0.3 μm, and having a solid content of 40% by weight, produced by Gifu Shellac Co., Ltd.)

Additive 2: Polymethyl methacrylate emulsion Eposter MX-050W (having an average particle size of 90 nm, having a solid content of 10% by weight, produced by Nippon Shokubai Co., Ltd.)

Additive 3: Acrylonitrile-styrene-alkyl acrylate-methacrylic acid copolymer emulsion Jodosol GD87B (having a solid content of 35% by weight, produced by Nippon NSC Co., Ltd.)

Additive 4: Trehalose powder solution (Treha mp. 97° C., produced by Hayashihara Shoji Co., Ltd.) having a solid content of 10% by weight Additive 5: Polyacrylic acid Julimer AC-10S (produced by Nippon Junyaku Co., Ltd.) having a solid content of 40% by weight Additive 6: Acid fading dye BOH (produced by Hodogaya Kagaku Kogyo Co., Ltd.) having a solid content of 1% by weight Additive 7: Cu—Fe—Mn metal oxide black pigment TM3550 black powder (having an average particle size of 0.1 μm, produced by Dainichi Seika Kogyo Co., Ltd.) having a solid content of 1% by weight Light-to-heat conversion dye 1

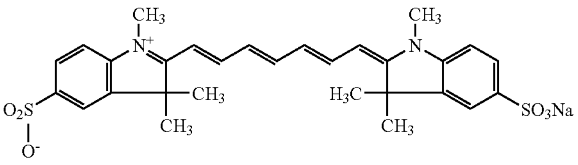

Light-to-heat conversion dye 2

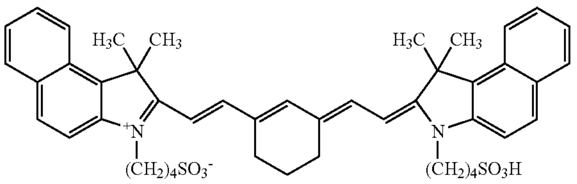

TABLE 1

| Material | Image formation layer coating liquid No. | | | | | | | |
|---|---|---|---|---|---|---|---|---|
| used | A | B | C | D | E | F | G | H |
| Additive 1 | 14.00 | 14.88 | — | — | 14.35 | 14.00 | — | 13.13 |
| Additive 2 | — | — | 59.50 | — | — | — | 56.00 | — |
| Additive 3 | — | — | — | 17.00 | — | — | — | — |
| Additive 4 | 7.00 | — | — | — | — | — | — | 7.00 |
| Additive 5 | — | 0.88 | 0.88 | 0.88 | 0.88 | 0.88 | 0.88 | — |
| Light-to-heat conversion dye 1 | 0.70 | 0.70 | 0.70 | 0.70 | — | — | — | — |
| Light-to-heat conversion dye 2 | — | — | — | — | 0.70 | 0.70 | 0.70 | — |
| Acid generating agent dispersion | — | — | — | — | 2.10 | 2.10 | 2.10 | — |
| Additive 1 | — | — | — | — | — | 14.00 | 14.00 | — |
| Additive 1 | — | — | — | — | — | — | — | 2.63 |
| Pure water | 78.30 | 83.55 | 38.93 | 81.43 | 81.98 | 68.33 | 26.33 | 77.25 |
| Solid content | 7.00 | 7.00 | 7.00 | 7.00 | 7.00 | 7.00 | 7.00 | 7.00 |

In Table 1, the numerical values represent % by weight.

<<Preparation of Printing Plate Material Sample>>

The above-obtained image formation layer coating liquid was coated on the aluminum support obtained above in a combination as shown in Table 2, and dried to give an image formation layer having a dry thickness as shown in Table 2. Thus, printing plate material samples 1 through 20 were prepared. The coated image formation layer was dried at 55° C. for 3 minutes, and then further aged at 40° C. for 24 hours.

<<Image Formation>>

Image formation was carried out by infrared laser exposure. Exposure was carried out employing an infrared laser (having a wavelength of 830 nm and a beam spot diameter of 18 μm) at an exposure energy of 300 mJ/cm$^2$, at a resolution of 2400 dpi to form a solid image and a dot image with an dot area of 1 to 99%, the beam being focused on the surface of the image formation layer. The term, "dpi" shows the number of dots per 2.54 cm. A solid image and a dot image with a dot area of from 1 to 99% were employed as an image for evaluation.

<<Evaluation>>

The formed images were evaluated as follows.

(Evaluation of Exposure Visualization)

The difference between the image formation layer at exposed portions and the image formation layer at unexposed portions in the exposed samples was visually observed, and evaluated according to the following criteria.

A: It was possible to confirm the difference between the image formation layer at exposed portions and the image formation layer at unexposed portions in the exposed samples.

B: It was almost possible to confirm the difference between the image formation layer at exposed portions and the image formation layer at unexposed portions in the exposed samples.

C: It was difficult to confirm the difference between the image formation layer at exposed portions and the image formation layer at unexposed portions in the exposed samples.

(Printing Method)

<Printing Method 1>

The exposed printing plate material sample was mounted on a plate cylinder of a printing press, DAIYA 1F-1 produced by Mitsubishi Jukogyo Co., Ltd. Printing was carried out employing a coated paper, dampening water, a 2% by weight solution of Astromark 3 (produced by Nikken Kagaku Kenkyusyo Co., Ltd.), and printing ink (TK Hyecho M Magenta, produced by Toyo Ink Manufacturing Co.). Printing was carried out in the same manner as sequence carried out in the conventional PS plate, provided that a special development was not carried out on the printing press.

<Printing Method 2>

Printing was carried out in the same manner as in Printing method 1, except that printing ink (TK Hyecho SOY 1 Magenta, produced by Toyo Ink Manufacturing Co.) was used instead of TK Hyecho M Magenta.

(Evaluation)

<Evaluation of Developability on Press>

The number of paper sheets printed from when printing started to when print with a solid image having a proper ink density, with a reproduced dot image with a dot area of 95%, and without stain was obtained was counted and evaluated as a measure of initial printability. Developability on press was evaluated according to the following criteria.

A: The number was less than 10.
B: The number was from 10 to less than 25.
C: The number was from 25 to less than 50.
D: The number was from 50 to less than 100.
E: The number was not less than 100.

<Evaluation of Stain 1>

Stain was observed in one hundredth printed paper sheet after printing started, and evaluated according to the following criteria:

A: No stain was observed.
B: Slight stain was observed.
C: Stain was observed.

<Evaluation of Stain 2>

Stain was observed in thirty hundredth printed paper sheet after printing started, and evaluated according to the following criteria:

A: No stain was observed.
B: Slight stain was observed.
C: Stain was observed.

The results are shown in Table 2.

TABLE 2

| | | Image formation layer | | | Printing method 1 | | | Printing method 2 | | | |
|---|---|---|---|---|---|---|---|---|---|---|---|
| Sample No. | Support No. | Coating liquid No. | Coating amount ($g/m^2$) | Exposure visualization | Developability on press | Stain 1 | Stain 2 | Developability on press | Stain 1 | Stain 2 | Remarks |
| 1 | 1 | A | 0.6 | B | B | A | A | B | A | A | Inv. |
| 2 | 2 | B | 0.6 | B | B | A | A | A | A | A | Inv. |
| 3 | 3 | A | 0.6 | B | B | A | A | A | A | A | Inv. |
| 4 | 3 | B | 0.5 | B | B | A | A | A | A | A | Inv. |
| 5 | 3 | C | 0.6 | B | B | A | A | A | A | A | Inv. |
| 6 | 4 | B | 0.6 | B | A | A | A | A | A | A | Inv. |
| 7 | 5 | A | 0.6 | B | B | A | A | A | A | A | Inv. |
| 8 | 5 | B | 0.6 | B | B | A | A | A | A | A | Inv. |
| 9 | 5 | D | 0.8 | B | B | A | A | A | A | A | Inv. |
| 10 | 6 | B | 0.6 | B | B | A | A | A | A | A | Inv. |
| 11 | 7 | A | 0.6 | B | A | A | A | A | A | A | Inv. |
| 12 | 8 | B | 0.6 | B | A | A | A | A | A | A | Inv. |
| 13 | 3 | E | 0.6 | A | B | A | A | A | A | A | Inv. |
| 14 | 3 | F | 0.6 | A | B | A | A | A | A | A | Inv. |
| 15 | 5 | E | 0.8 | A | B | A | A | A | A | A | Inv. |
| 16 | 5 | G | 0.6 | A | B | A | A | B | A | A | Inv. |
| 17 | 9 | A | 0.6 | B | C | A | B | C | A | B | Comp. |
| 18 | 9 | C | 0.5 | B | D | A | C | D | A | C | Comp. |
| 19 | 10 | G | 0.6 | B | E | C | C | E | C | C | Comp. |
| 20 | 3 | H | 1.0 | C | C | A | A | C | A | A | Comp. |

Inv.; Invention
Comp.; Comparative

As is apparent from Table 2, inventive printing plate material samples, defined in invention, provide good initial printing performance, and do not produce stain in the printed paper sheet after a considerable number of paper sheets were printed as well as in the initial printed paper sheet, regardless of kinds of printing ink used, as compared with comparative printing plate material samples.

[Effect of the Invention]

The present invention can provide a printing plate material, which is capable of recording an image employing infrared laser, and provides improved development on press, improved exposure visualization, and minimized stain of printed paper sheets.

What is claimed is:

1. A printing plate material comprising an aluminum support, and provided thereon, an image formation layer containing thermoplastic particles, a light-to-heat conversion dye, and a mixture of an electron providing dye precursor and an electron accepting developing agent, the printing plate material being capable of being developed on a printing press, wherein the image formation layer changes in color due to infrared laser exposure, and the aluminum support is manufactured by a method comprising the steps of subjecting an aluminum plate to electrolytic surface roughening treatment, subjecting the electrolytic surface roughened aluminum plate to etching treatment in an aqueous alkali solution, and subjecting the resulting aluminum plate to anodization treatment.

2. The printing plate material of claim 1, wherein an etching amount of the electrolytic surface roughened aluminum plate etched by the etching treatment is 0.05 to 2.0 $g/m^2$.

3. The printing plate material of claim 1, wherein mechanical surface roughening treatment is carried out prior to the electrolytic surface roughening treatment.

4. The printing plate material of claim 2, wherein mechanical surface roughened treatment is carried out prior to the electrolytic surface roughening treatment.

5. The printing plate material of claim 1, wherein the light-to-heat conversion dye is a cyanine dye having an absorption maximum of from 700 to 12,000 nm.

6. The printing plate material of claim 1, wherein the light-to-heat conversion, dye content of the image formation layer is from 0.01 to 10% by weight and the thermoplastic particle content of the image formation layer is from 1 to 90% by weight.

7. The printing plate material of claim 1, wherein the light-to-heat conversion dye in the image formation layer changes in color due to infrared laser exposure.

8. The printing plate material of claim 1, wherein the image formation layer further contains a water soluble resin.

9. The printing plate material of claim 8, wherein the water soluble resin is oligosaccharide, polysaccharide or polyacrylic acid.

10. The printing plate material of claim 9, wherein the oligosaccharide is trehalose.

11. A method of manufacturing a printing plate material comprising an aluminum support, and provided thereon, an image formation layer, the printing plate material being capable of being developed on a printing press, the method comprising the steps of:

subjecting an aluminum plate to electrolytic surface roughening treatment;

subjecting the electrolytic surface roughened aluminum plate to etching treatment in an aqueous alkali solution to give an etching amount of the electrolytic surface roughened aluminum plate of 0.05 to 2.0 $g/m^2$;

subjecting the resulting aluminum plate to anodization treatment, whereby an aluminum support is obtained; and providing on the aluminum support an image formation layer which contains thermoplastic particles, a light-to-heat conversion dye, and a mixture of an electron providing dye precursor and an electron accepting developing agent, and changes in color due to infrared laser exposure.

12. The method of claim 11, wherein mechanical surface roughening treatment is carried out prior to the electrolytic surface roughening treatment.

13. The method of claim 11, wherein the light-to-heat conversion dye is a cyanine dye having an absorption maximum of from 700 to 12,000 nm.

14. The method of claim 11, wherein the light-to-heat conversion dye content of the image formation layer is from 0.01 to 10% by weight and the thermoplastic particle content of the image formation layer is from 1 to 90% by weight.

15. The method of claim 11, wherein the light-to-heat conversion dye in the image formation layer changes in color due to infrared laser exposure.

16. The method of claim 11, wherein the image formation layer further contains a water soluble resin.

17. The method of claim 16, wherein the water soluble resin is oligosaccharide, polysaccharide or polyacrylic acid.

18. The method of claim 17, wherein the oligosaccharide is trehalose.

19. The printing plate material of claim 1, wherein the electron providing dye precursor is selected from the group consisting of a triarylmethane compound, a diphenylmethane compound, spiropyran compound, a fluoran compound, a rhodamine lactam compound and a carbazolylmethane compound, and the electron accepting developing agent is selected from the group consisting of a phenol compound, a thiophenol compound, a thiourea derivative, an organic acid or its metal salt, and oxyesters.

20. The method of claim 11, wherein the electron providing dye precursor is selected from the group consisting of a triarylmethane compound, a diphenylmethane compound, spiropyran compound, a fluoran compound, a rhodamine lactam compound and a carbazolylmethane compound, and the electron accepting developing agent is selected from the group consisting of a phenol compound, a thiophenol compound, a thiourea derivative, an organic acid or its metal salt, and oxyesters.

* * * * *